(12) United States Patent
Suto et al.

(10) Patent No.: US 9,983,448 B2
(45) Date of Patent: May 29, 2018

(54) WIRING BODY ASSEMBLY, STRUCTURE WITH CONDUCTOR LAYER, AND TOUCH SENSOR

(71) Applicant: FUJIKURA LTD., Tokyo (JP)

(72) Inventors: Yuki Suto, Chiba (JP); Tetsu Hammura, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days. days.

(21) Appl. No.: 15/508,875

(22) PCT Filed: Jul. 7, 2016

(86) PCT No.: PCT/JP2016/070123
§ 371 (c)(1),
(2) Date: Mar. 3, 2017

(87) PCT Pub. No.: WO2017/022398
PCT Pub. Date: Feb. 9, 2017

(65) Prior Publication Data
US 2017/0199412 A1    Jul. 13, 2017

(30) Foreign Application Priority Data
Jul. 31, 2015    (JP) .................... 2015-152535

(51) Int. Cl.
*H01L 29/40* (2006.01)
*G02F 1/1345* (2006.01)
(Continued)

(52) U.S. Cl.
CPC .......... *G02F 1/13452* (2013.01); *G06F 3/041* (2013.01); *G06F 3/044* (2013.01);
(Continued)

(58) Field of Classification Search
CPC .... G02F 1/13452; H05K 1/0287; H05K 1/14; H05K 1/02; H01L 23/4985;
(Continued)

(56) References Cited

U.S. PATENT DOCUMENTS

| | | |
|---|---|---|
| 5,839,188 A | 11/1998 | Pommer |
| 6,147,870 A | 11/2000 | Pommer |

(Continued)

FOREIGN PATENT DOCUMENTS

| | | |
|---|---|---|
| JP | 2000-515680 A | 11/2000 |
| JP | 2005-011312 A | 1/2005 |

(Continued)

OTHER PUBLICATIONS

Office Action issued in corresponding Japanese Application No. 2017-505658 dated Apr. 4, 2017, and English translation thereof (7 pages).

(Continued)

*Primary Examiner* — Vu A Vu
(74) *Attorney, Agent, or Firm* — Osha Liang LLP

(57) ABSTRACT

A wiring body assembly includes a first wiring body that includes a first resin layer serving as a support layer and a first conductor layer provided on the first resin layer that includes a first terminal, a second wiring body that includes a third terminal, and a connection body that includes a resin material and conductive particle dispersed in the resin material. The connection body is interposed between the first and third terminals such that the first wiring body and the second wiring body are electrically connected. The first terminal includes terminal conductor wires arranged in the shape of a mesh and the connection body is in a gap between the terminal conductor wires.

5 Claims, 18 Drawing Sheets

(51) Int. Cl.
  *G06F 3/041* (2006.01)
  *G06F 3/044* (2006.01)
  *H05K 1/02* (2006.01)
  *H05K 1/14* (2006.01)
  *H01L 23/498* (2006.01)

(52) U.S. Cl.
  CPC ........... *H01L 23/4985* (2013.01); *H05K 1/02* (2013.01); *H05K 1/0287* (2013.01); *H05K 1/14* (2013.01); *H01L 2224/01* (2013.01); *H01L 2924/01029* (2013.01)

(58) Field of Classification Search
  CPC ....... H01L 2924/01029; H01L 2224/01; G06F 3/041; G06F 3/044
  USPC ......................................................... 257/750
  See application file for complete search history.

(56) References Cited

U.S. PATENT DOCUMENTS

| | | | |
|---|---|---|---|
| 6,246,014 B1 | 6/2001 | Pommer | |
| 8,115,322 B2 * | 2/2012 | Arifuku | C09J 4/06 252/512 |
| 2004/0238910 A1 | 12/2004 | Fujii et al. | |
| 2008/0171182 A1 * | 7/2008 | Kawate | H05K 3/323 428/209 |
| 2011/0182046 A1 | 7/2011 | Shiota | |
| 2014/0290991 A1 | 10/2014 | Tang et al. | |
| 2016/0250875 A1 * | 9/2016 | Tarnowski | H05K 3/1275 345/173 |

FOREIGN PATENT DOCUMENTS

| | | |
|---|---|---|
| JP | 2008-248044 A | 10/2008 |
| JP | 2010-272545 A | 12/2010 |
| JP | 2011-253979 A | 12/2011 |
| JP | 2012/150580 A | 8/2012 |
| JP | 2014-022229 A | 2/2014 |
| JP | 2014-067075 A | 4/2014 |
| JP | 2014-099199 A | 5/2014 |
| JP | 2015-056285 A | 3/2015 |
| TW | 201437868 A | 10/2014 |

OTHER PUBLICATIONS

Japanese Official Action issued in application No. 2015-152535 dated May 17, 2016 (3 pages).
Office Action issued in corresponding Taiwanese Application No. 105122357 dated Apr. 17, 2017 (7 pages).
Office Action issued in corresponding Japanese Application No. 2017-505658 dated Jul. 18, 2017 (6 pages).
Extended European Search Report in counterpart European Application No. 16 83 2677.5 dated Oct. 13, 2017 (8 pages).

* cited by examiner

WIRING BODY ASSEMBLY, STRUCTURE WITH CONDUCTOR LAYER, AND TOUCH SENSOR

TECHNICAL FIELD

The present invention relates to a wiring body assembly, a structure with a conductor layer, and a touch sensor.

In designated nations where incorporation of documents by reference is accepted, the contents disclosed in Japanese Patent Application No. 2015-152535, filed Jul. 31, 2015 in Japan is incorporated by reference into this specification, and is regarded as a part of the disclosure of this specification.

BACKGROUND ART

There is known a connection structure for a printed wiring board including two printed wiring boards connected to each other and in which electricity is conducted between connection electrode portions through an anisotropic conductive adhesive (for example, see Patent Document 1).

CITATION LIST

Patent Document

Patent Document 1: JP 2011-253979 A

SUMMARY OF THE INVENTION

Problem to be Solved by the Invention

In the connection structure for a printed wiring board, conductive particles contained in the anisotropic conductive adhesive flow out of a portion between the connection electrode portions while one printed wiring board is pressed against the other printed wiring board. Accordingly, the amount of the conductive particles interposed between the connection electrode portions is reduced. For this reason, there is a problem that electrical connection reliability may deteriorate.

Problems to be solved by the present invention include providing a wiring body assembly, a structure with a conductor layer, and a touch sensor that improve connection reliability between a first wiring body and a second wiring body.

Means for Solving Problem

A wiring body assembly according to the invention includes a first wiring body including a support layer and a conductor layer provided on the support layer and including a first terminal, a second wiring body including a second terminal, and a connection body including a resin material and conductive particles dispersed in the resin material and is interposed between the first and second terminals such that the first wiring body and the second wiring body are electrically connected. The first terminal includes conductor wires arranged in the shape of a mesh, and the connection body is in a gap between the conductor wires.

In the invention, the conductor wires may define openings by crossing each other, and the following Formula (1) may be satisfied.

$$D_1 < D_2 \quad (1)$$

In the Formula (1), $D_1$ denotes the diameter of a circle inscribed in the opening and $D_2$ denotes the diameter of the conductive particle.

In the invention, the following Formula (2) may be satisfied.

$$D_1 \leq D_2 \times \sqrt[2]{3} \quad (2)$$

In the invention, the conductor wire may face the second terminal through the connection body, and may include a substantially flat surface having a linear shape in cross-sectional view.

In the invention, the support layer may be made of a resin material, and the storage modulus of the material of the resin layer at a temperature within a range of 130 to 200° C. may be 10 MPa or more.

A structure with a conductor layer according to the invention includes the wiring body assembly, and a support provided on at least one main surface of the first wiring body.

A touch sensor according to the invention includes the structure with a conductor layer.

Effect of the Invention

According to the invention, the conductor wires of the first terminal are arranged in the shape of a mesh. In the invention, since many conductive particles of the connection body can be caught by the mesh, many conductive particles can be interposed between the first and second terminals. Accordingly, connection reliability between the first and second wiring bodies is improved.

MODE(S) FOR CARRYING OUT THE INVENTION

Embodiments of the invention will be described below with reference to the drawings. Meanwhile, for easy understanding of the characteristics of the invention, main parts of drawings used in the following description may be enlarged and illustrated for convenience sake. Accordingly, the ratios of the dimensions of each component and the like are not always equal to the actual those thereof.

Figure 1:
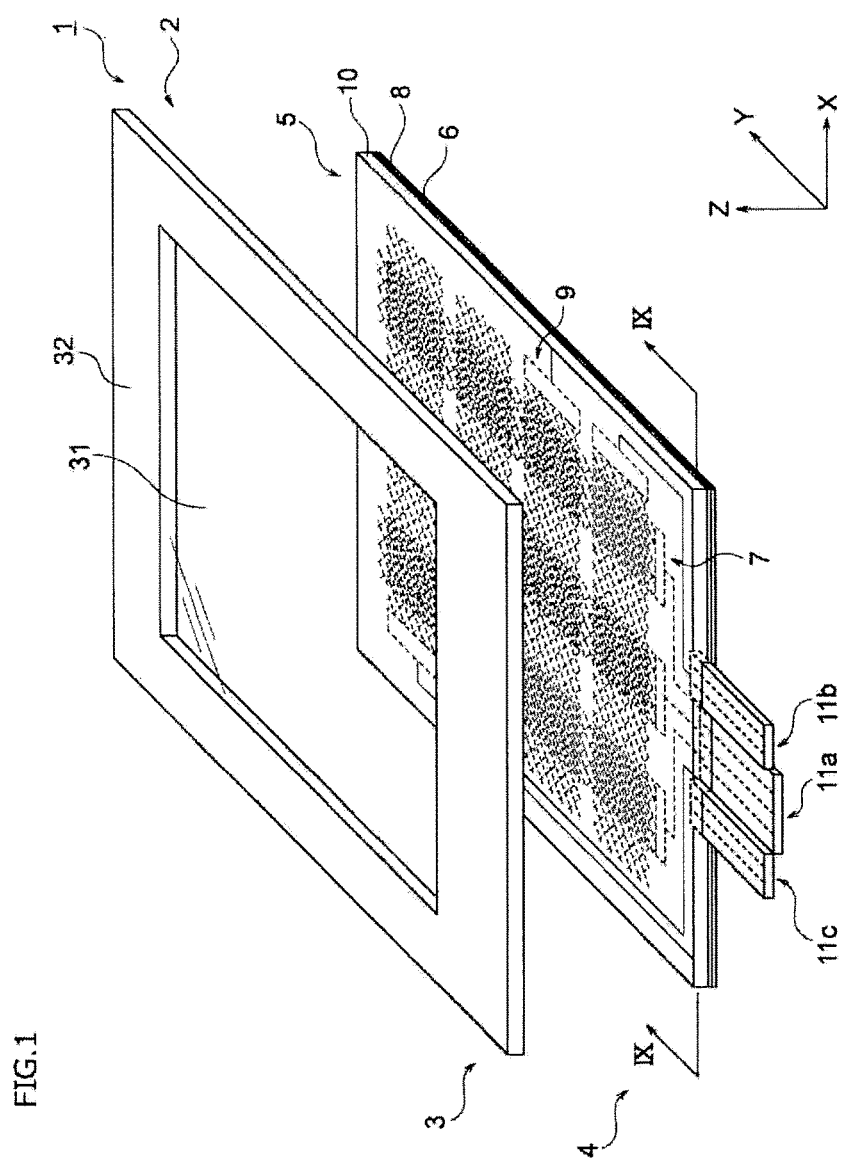
FIG. 1 is an exploded perspective view of a touch panel according to an embodiment of the invention.
Figure 2:
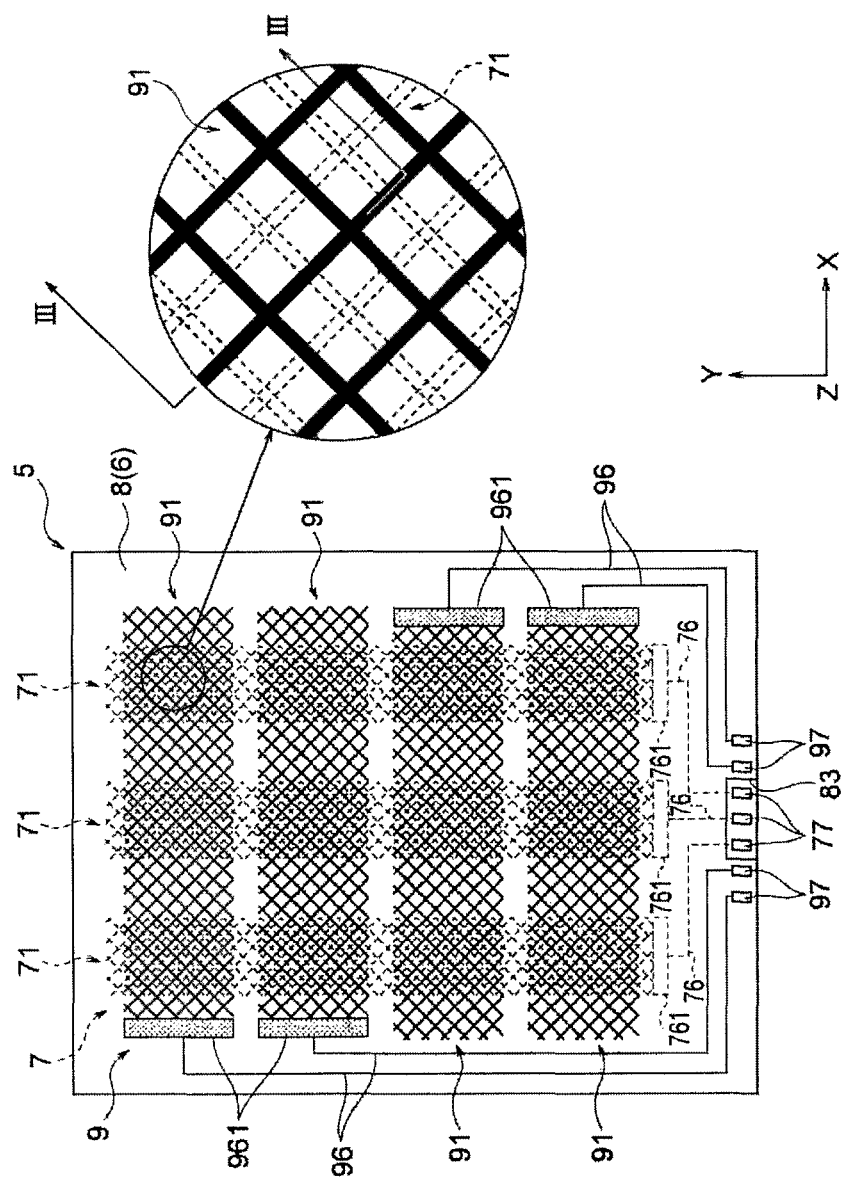
FIG. 2 is a plan view of a first wiring body according to an embodiment of the invention.
Figure 3:
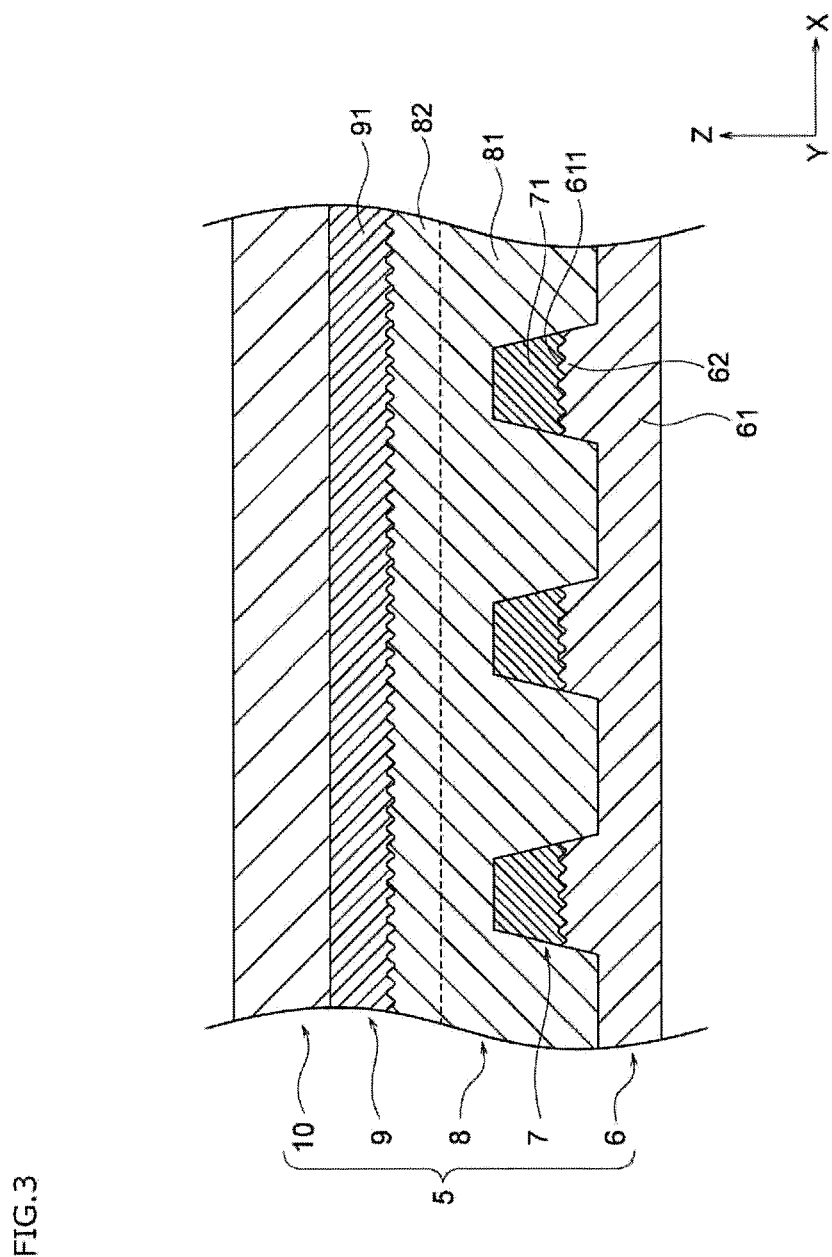
FIG. 3 is a cross-sectional view taken along line III-III of FIG. 2.
Figure 4:
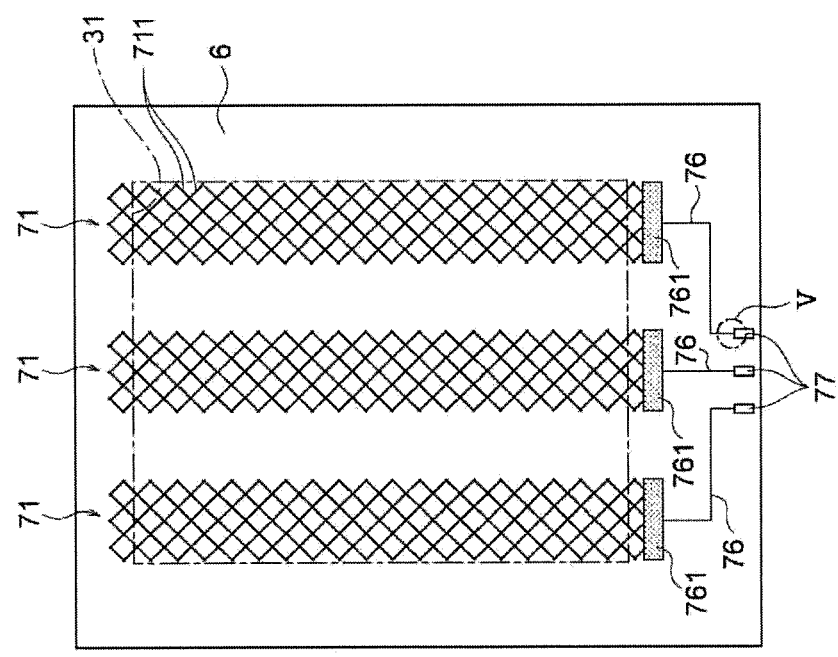
FIG. 4 is a plan view of the first wiring body according to the embodiment of the invention and is a view used to illustrate the first conductor layer.
Figure 5:
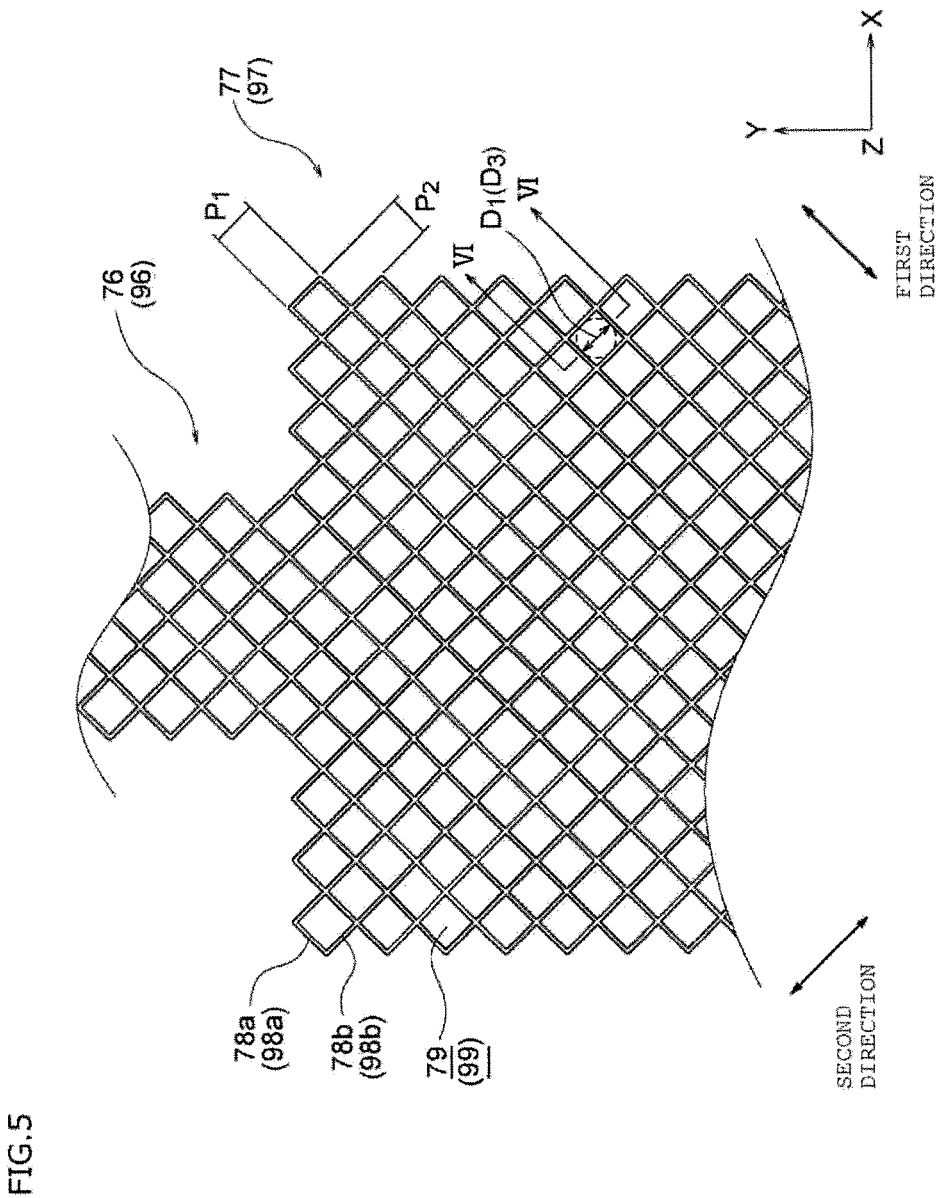
FIG. 5 is a partial enlarged view of a portion V of FIG. 4.
Figure 6:
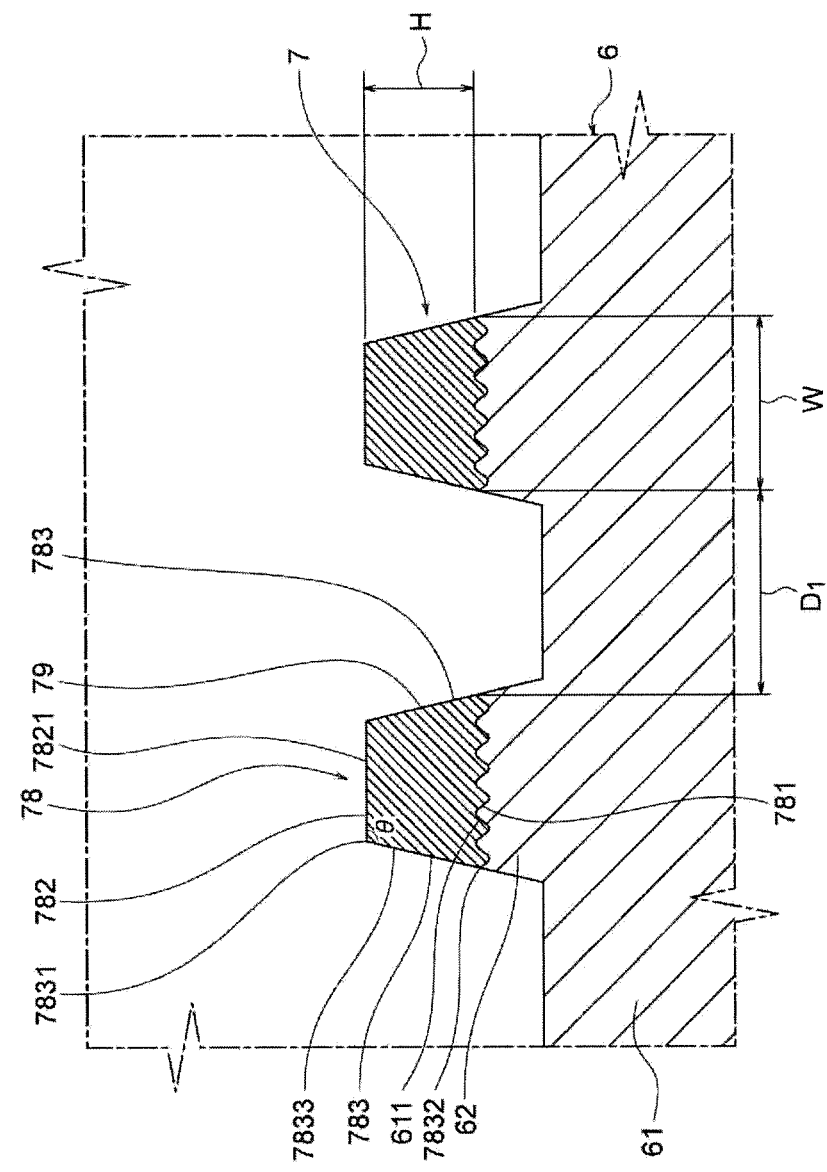
FIG. 6 is a cross-sectional view taken along line VI-VI of FIG. 5.
Figure 7:
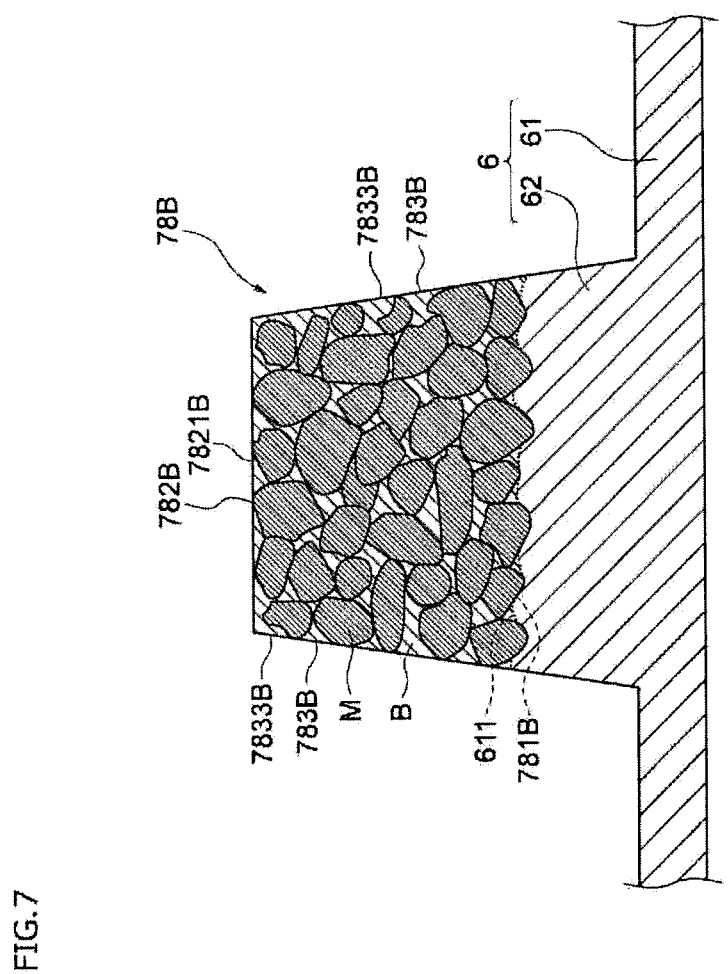
FIG. 7 is a cross-sectional view of a conductor wire according to an embodiment of the invention.
Figure 8:
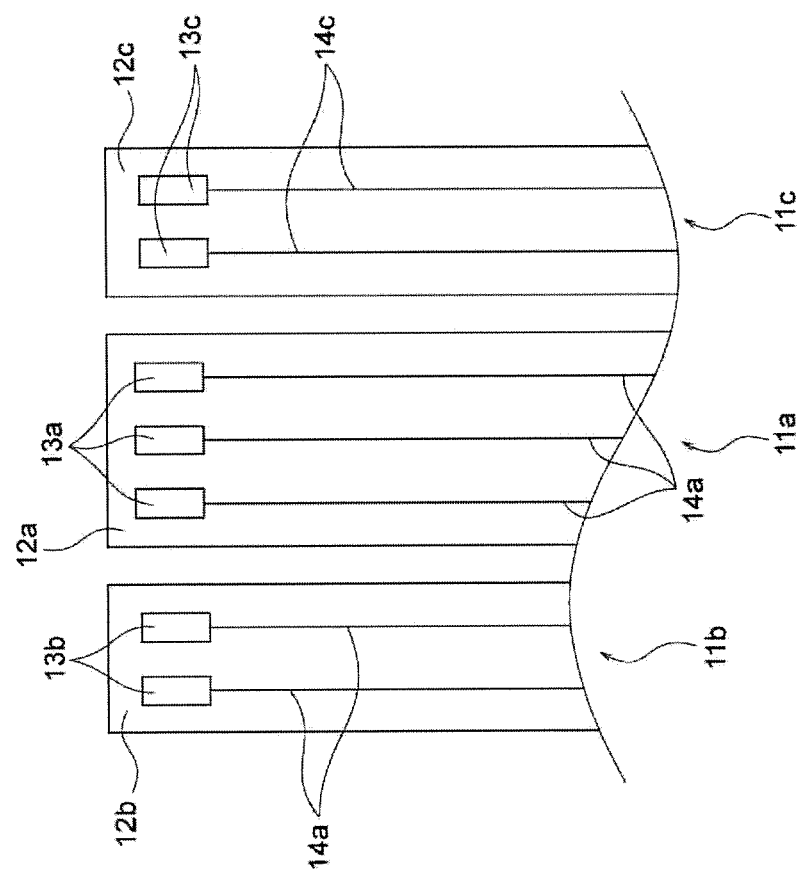
FIG. 8 is a back view of second wiring bodies according to an embodiment of the invention.
Figure 9:
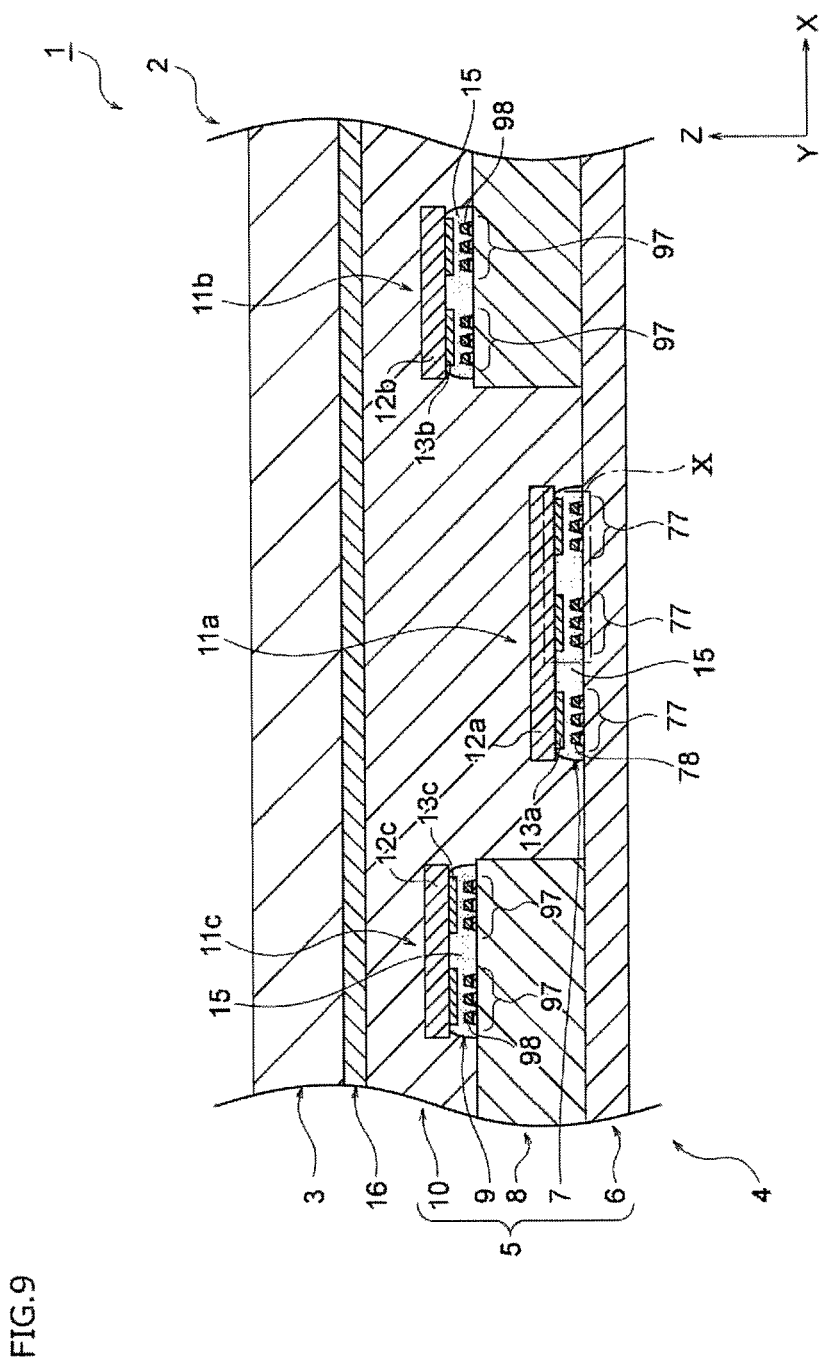
FIG. 9 is a cross-sectional view taken along line IX-IX of FIG. 1.
Figure 10:
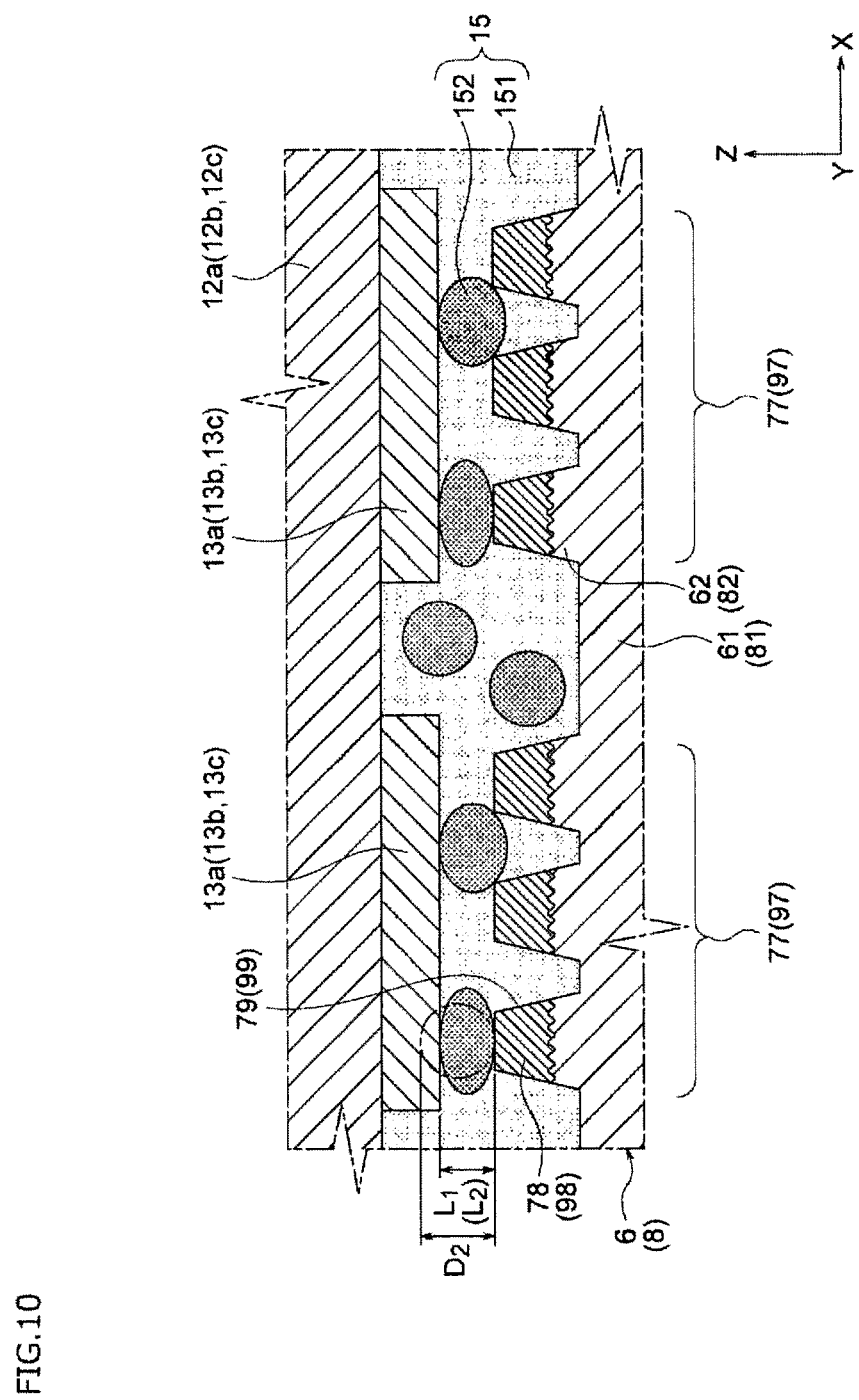
FIG. 10 is a partial enlarged view of a portion X of FIG. 9.

FIG. 1 is an exploded perspective view of a touch panel according to an embodiment of the invention, FIG. 2 is a plan view of a first wiring body according to an embodiment of the invention, FIG. 3 is a cross-sectional view taken along line III-III of FIG. 2, FIG. 4 is a plan view of the first wiring body according to the embodiment of the invention and is a view used to illustrate the first conductor layer, FIG. 5 is a partial enlarged view of a portion V of FIG. 4, FIG. 6 is a cross-sectional view taken along line VI-VI of FIG. 5, FIG. 7 is a cross-sectional view of a conductor wire according to an embodiment of the invention, FIG. 8 is a back view of second wiring bodies according to an embodiment of the invention, FIG. 9 is a cross-sectional view taken along line IX-IX of FIG. 1, and FIG. 10 is a partial enlarged view of a portion X of FIG. 9.

A touch panel 1 of this embodiment is a projection-type electrostatic capacitive touch panel sensor, and may be combined with, for example, a display device (not illustrated) or the like to be used as a display device having a function to detect a touch position. The display device is not particularly limited, and a liquid crystal display, an organic EL display, and the like can be used as the display device. The touch panel 1 includes detection electrodes and drive electrodes disposed so as to face each other and have translucency, and a predetermined voltage is periodically applied between the two kinds of electrodes.

For example, when an operator's finger (an external conductor) approaches the touch panel 1, a capacitor (capacitance) is formed between the external conductor and the touch panel 1 and an electrical state between the two kinds of electrodes is changed in the touch panel 1. The touch panel 1 can detect the position of the operation of an operator on the basis of an electric change between the two kinds of electrodes. The "touch panel 1" of this embodiment corresponds to an example of a "touch sensor" of the invention.

As illustrated in FIG. 1, the touch panel 1 of this embodiment is formed of a structure 2 with a conductor layer (hereinafter, also simply referred to as a structure 2). The structure 2 includes a cover panel 3, a wiring body assembly 4, and a transparent adhesive layer 16 (see FIG. 9). The "structure 2 with a conductor layer" of this embodiment corresponds to an example of a "structure with a conductor layer" of the invention, the "cover panel 3" of this embodiment corresponds to an example of a "support" of the invention, and the "wiring body assembly 4" of this embodiment corresponds to an example of a "wiring body assembly" of the invention.

As illustrated in FIG. 1, the cover panel 3 is provided to prevent the wiring body assembly 4 from being contaminated, damaged, discolored, and the like. For example, glass materials, such as soda-lime glass and borosilicate glass, and resin materials, such as polymethylmethacrylate (PMMA) and polycarbonate (PC), can be used as the material of the cover panel 3. It is preferable that a material having a total light transmittance of 90% or more is used as the material of the cover panel 3.

The cover panel 3 is provided on one main surface of a first wiring body 5 to be described below. The cover panel 3 includes a transparent portion 31 that can transmit visible light and a blocking portion 32 blocking visible light. The blocking portion 32 is formed by the application of, for example, black ink to the back surface of the cover panel 3. Black ink is not applied to a rectangular region positioned at a substantially central portion of the back surface of the cover panel 3, so that the transparent portion 31 transmitting visible light is formed. That is, the blocking portion 32 is formed in the shape of a frame surrounding the transparent portion 31 in plan view.

The transparent portion 31 corresponds to the electrodes (the detection electrodes and the drive electrodes) of the touch panel 1 and overlaps the electrodes in plan view. The blocking portion 32 is formed in a region except for the region corresponding to the electrodes of the touch panel 1 so that lead-out wires and connection terminals cannot be visually recognized.

The wiring body assembly 4 includes a first wiring body 5, second wiring bodies 11, and connection bodies 15 (see FIG. 9).

As illustrated in FIGS. 2 and 3, the first wiring body 5 includes a first resin layer 6, a first conductor layer 7, a second resin layer 8, a second conductor layer 9, and a third resin layer 10, and these layers are stacked in this order. Meanwhile, for easy understanding of the structure of the first wiring body 5, in FIG. 2, the third resin layer 10 is not illustrated and the second conductor layer 9 is illustrated by a solid line. The "first wiring body 5" of this embodiment corresponds to an example of a "first wiring body" of the invention.

The first resin layer 6 is a support layer for integrally holding the first conductor layer 7, and is made of a material having transparency (translucency). For example, UV curable resins, such as an epoxy resin, an acrylic resin, a polyester resin, a urethane resin, a vinyl resin, a silicone resin, a phenolic resin, and a polyamide resin; a thermosetting resin or a thermoplastic resin; and the like can be used as the material of the first resin layer 6. Meanwhile, the material of the support layer is not particularly limited to a resin material.

In a case in which the support layer is made of a resin material, although details will be described below, the storage modulus of the material of the first resin layer 6 at a temperature within a range of 130° C. to 200° C. is preferably 10 MPa or more and more preferably 20 MPa or more from the point of view of improvement of connection reliability between the first wiring body 5 (specifically, the first conductor layer 7) and the second wiring body 11.

The storage modulus means the arithmetic mean value (average storage modulus) of the storage modulus of the material of the first resin layer 6 at a temperature within a range of 130° C. to 200° C. The average storage modulus is measured as specifically described below by reference to "JIS K 7244: Plastics-Determination of dynamic mechanical properties". That is, the storage modulus of the first resin layer 6 is measured at a predetermined frequency by a viscoelasticity determination device (trade name: EXSTAR DMS6100, manufactured by SII NanoTechnology Inc.), and an arithmetic mean value of the measured storage modulus of the first resin layer 6 is obtained. In more detail, a measurement sample, which is cut from the first resin layer 6 so as to have a sample size corresponding to a length of 40 mm and a width of 10 mm, is set on a jig for film tensile measurement; and the storage modulus of the measurement sample is measured at a predetermined frequency (at an interval of 1° C.) under conditions of a temperature in the measured temperature range of 130 to 200° C., a frequency of 1 Hz, a strain of 0.2% or less, a rate of temperature increase of 2° C./min, and $N_2$ atmosphere; and an arithmetic mean value of the storage modulus measured at each temperature is obtained.

As illustrated in FIG. 3, the first resin layer 6 includes a smooth portion 61 formed so as to have a substantially constant thickness and support portions 62 formed on the smooth portion 61. It is preferable that the thickness of the smooth portion 61 is within a range of 5 μm to 100 μm. The support portions 62 are formed between the smooth portion 61 and the first conductor layer 7, and are formed so as to protrude in a direction in which the support portions 62 are away from the smooth portion 61 (an upward direction in FIG. 3).

The first resin layer 6 is in contact with the first conductor layer 7 on the upper surfaces (upper surfaces in FIG. 3. Hereinafter, also referred to as contact surfaces 611) of the support portions 62. Each of the support portions 62 has two substantially flat side surfaces inclined such that the flat side surfaces approach each other as being separated from the smooth portion 61 in cross-section taken in a lateral direction. Meanwhile, the cross-section taken in a lateral direction, which is mentioned here, means the cross-section taken in the lateral direction of a conductor wire forming the first conductor layer 7 being in contact with the support portions 62.

Each of the contact surfaces 611 has a concave-convex shape that is complementary to a concave-convex shape of the contact surface of the conductor wire of the first conductor layer 7 being in contact with the first resin layer 6 in cross-sectional view taken in the lateral direction (see FIGS. 3 and 6.). In cross-sectional view taken in a longitudinal direction (in cross-sectional view taken in the extending direction of the conductor wire of the first conductor layer 7), the contact surface 611 and the contact surface of the conductor wire of the first conductor layer 7, which is in contact with the first resin layer 6, have concave-convex shapes that are complementary to each other. In order to illustrate the first wiring body 5 of this embodiment so that the first wiring body 5 is easily understood, the concave-convex shape of the contact surface 611 and the concave-convex shape of the contact surface of the conductor wire of the first conductor layer 7, which is in contact with the first resin layer 6, are exaggeratingly illustrated in FIGS. 3 and 6.

The first conductor layer 7 is directly formed on the first resin layer 6. The first conductor layer 7 is made of conductive powder and a binder resin. Examples of the conductive powder, which forms the first conductor layer 7, can include: metal materials, such as silver, copper, nickel, tin, bismuth, zinc, indium, and palladium; and carbon-based materials, such as graphite, carbon black (furnace black, acetylene black, and Ketjen black), carbon nanotube, and carbon nanofiber. Meanwhile, metal salt, which is the salt of the above-mentioned metal, may be used other than the conductive powder.

Conductive powder having a particle size φ within a range of, for example, 0.5 μm to 2 μm (0.5 μm≤φ≤2 μm) can be used as the conductive powder, which is contained in the first conductor layer 7, in accordance with the width of the conductor wire of the first conductor layer 7. Meanwhile, from the point of view of stabilization of the value of electrical resistance of the first conductor layer 7, it is preferable that conductive powder having an average particle size φ, which is equal to or smaller than the half of the width of the conductor wire of the first conductor layer 7, is used. Further, it is preferable that particles having a specific surface area of 20 $m^2/g$ or more, which is measured by a BET method, are used as the conductive powder.

It is preferable that a metal material is used as the conductive powder in a case in which the relatively small value of electrical resistance of the first conductor layer 7, which is equal to or smaller than a certain value, is required. However, a carbon-based material can be used as the conductive powder in a case in which the relatively large value of electrical resistance of the first conductor layer 7, which is equal to or larger than a certain value, is allowed. Meanwhile, from the point of view of improvement of the haze and total light reflectance of a mesh film, it is preferable that a carbon-based material is used as the conductive powder.

In this embodiment, electrode layers are formed in the shape of a mesh so that optical transparency is given to the first conductor layer 7. In this case, metal materials, such as silver, copper, and nickel, and conductive materials, which have been described as the above-mentioned carbon-based materials and are excellent in conductivity but are opaque, (opaque metal materials and opaque carbon-based materials) can be used as a conductive material forming the first conductor layer 7.

An acrylic resin, a polyester resin, an epoxy resin, a vinyl resin, a urethane resin, a phenolic resin, a polyamide resin, a silicone resin, a fluororesin, and the like can be exemplified as the binder resin forming the first conductor layer 7. Meanwhile, the binder resin may be omitted from material of the first conductor layer 7.

Conductive paste is applied and hardened to form the first conductor layer 7. Conductive paste in which conductive powder, a binder resin, water or a solvent, and various additives are mixed can be exemplified as a specific example of the conductive paste. α-terpineol, butyl carbitol acetate, butyl carbitol, 1-decanol, butyl cellosolve, diethylene glycol monoethyl ether acetate, tetradecane, and the like can be exemplified as the solvent contained in the conductive paste.

As illustrated in FIG. 4, the first conductor layer 7 includes first mesh-shaped electrode layers 71, first lead-out wires 76, and first terminals 77. The first mesh-shaped electrode layers 71 are the detection electrodes of the touch panel 1. The first lead-out wires 76 and the first terminals 77 are to be provided to output detection signals from the first mesh-shaped electrode layers 71 to the outside of the touch panel 1. The first mesh-shaped electrode layers 71, the first lead-out wires 76, and the first terminals 77 are integrally formed in this embodiment. "Integrally" means that members are not separated from each other and are formed as an integrated structure by using the same material (conductive particles having the same particle size, a binder resin, and the like).

The electrodes (the drive electrode and the detection electrode) of the touch panel 1 need to have translucency to allow image information, which is displayed in the display device, to be visually recognized. However, since each of the first mesh-shaped electrode layers 71 is formed in the shape of a mesh in which electrode conductor wires 711 having conductivity cross each other, translucency is given to the first mesh-shaped electrode layers 71. In this embodiment, the first conductor layer 7 includes three first mesh-shaped electrode layers 71 extending in a Y direction in substantially parallel to each other, and the first mesh-shaped electrode layers 71 are provided so as to correspond to the transparent portion 31 of the cover panel 3.

The shapes and arrangement of the electrode conductor wires 711 of the first mesh-shaped electrode layers 71 are not particularly limited as long as the first mesh-shaped electrode layers 71 have translucency. In this embodiment, each of the electrode conductor wires 711 of the first mesh-shaped electrode layers 71 is formed to have a width narrower than the width of each of terminal conductor wires 78 of the first terminals 77 to be described below. The width of the electrode conductor wire 711 is preferably within a range of 50 nm to 1000 μm, more preferably within a range of 500 nm to 150 μm, still more preferably within a range of 1 μm to 10 μm, and yet more preferably within a range of 1 μm to 5 μm. Further, the height of the electrode conductor wire 711 is preferably within a range of 50 nm to 3000 μm, more preferably within a range of 500 nm to 450 μm, and still more preferably within a range of 500 nm to 10 μm. Furthermore, a pitch of adjacent electrode conductor wires 711 among the electrode conductor wires 711 of the first mesh-shaped electrode layers 71 is larger than a pitch of adjacent terminal conductor wires 78 among terminal conductor wires 78 of the first terminals. Meanwhile, in this specification, the pitch means a distance between centers.

As illustrated in FIG. 4, the first lead-out wires 76 are provided so as to correspond to the first mesh-shaped electrode layers 71. In this embodiment, three first lead-out wires 76 are formed for three first mesh-shaped electrode layers 71. One end portion of the first lead-out wire 76 is led from the side of each first mesh-shaped electrode layer 71, which corresponds to −Y direction in FIG. 4, through a lead portion 761. Meanwhile, a position at which the lead portion 761 is provided is not particularly limited on the outer edge of the first mesh-shaped electrode layer 71. Further, the first lead-out wire 76 is connected to the first mesh-shaped electrode layer 71 through the lead portion 761 in this embodiment. However, the invention is not particularly limited thereto and the first lead-out wire 76 and the first mesh-shaped electrode layer 71 may be directly connected to each other.

As in the case of the first mesh-shaped electrode layer 71, each of the first lead-out wires 76 is formed in the shape of a mesh in which conductor wires having conductivity cross each other. Since the first lead-out wires 76 are provided so as to correspond to the blocking portion 32 of the cover panel 3, the first lead-out wires 76 do not need to have translucency. However, from the point of view of easy integration of the first mesh-shaped electrode layers 71, the first lead-out wires, and the first terminals 77, the first lead-out wires 76 are formed in the shape of a mesh. Meanwhile, the shapes and arrangement of the conductor wires of the first lead-out wires 76 are not particularly limited. Each of the first lead-out wires 76 has the same shape (contour) as each of the terminal conductor wires 78 of the first terminals 77 to be described below, and the conductor wires are arranged in the same manner as the terminal conductor wires 78.

As illustrated in FIG. 4, (a total of three) first terminals 77 are formed at the other end portions of the first lead-out wires 76, respectively. The first terminals 77 are provided so as to correspond to the blocking portion 32 of the cover panel 3, and are positioned near the outer edge of the first wiring body 5 corresponding to −Y direction. The first terminals 77 are arranged in a Y direction, and are concentrated near the middle of the first wiring body 5 in an X direction so as to be easily connected to the second wiring bodies 11. Meanwhile, the first lead-out wires 76 are arranged while being bent according to the concentrated first terminals 77.

Since the width of the first terminal 77 is formed to be larger than the width of the first lead-out wire 67 as illustrated in FIG. 5 in this embodiment, stepped portions are formed between the first terminal 77 and the first lead-out wire 67. However, the invention is not limited thereto, and the width of the first lead-out wire 67 may be the same as the width of the first terminal 77. That is, both side ends of the first lead-out wire 67 and both side ends of the first terminal 77 may be continuous with each other.

As illustrated in FIG. 5, each of the first terminals 77 of this embodiment is formed in the shape of a mesh in which terminal conductor wires 78a and 78b having conductivity cross each other. In this embodiment, three first terminals 77 are present and each of the first terminals 77 is formed in the shape of a mesh in which the terminal conductor wires 78a and 78b cross each other. Meanwhile, in this specification, "terminal conductor wires 78a" and "terminal conductor wires 78b" are collectively referred to as "terminal conductor wires 78" as necessary.

The width W of the terminal conductor wire 78 is preferably within a range of 1 μm to 1000 μm, more preferably within a range of 1 μm to 150 μm, still more preferably within a range of 5 μm to 50 μm, and yet more preferably within a range of 5 μm to 30 μm. Further, the height H of the terminal conductor wire 78 is preferably within a range of 1 μm to 3000 μm, more preferably within a range of 1 μm to 450 μm, and still more preferably within a range of 1 μm to 150 μm.

As illustrated in FIG. 6, the contour of each terminal conductor wire 78 of this embodiment is formed by a contact surface 781, a top surface 782, and two side surfaces 783. The contact surface 781 is a concave-convex surface having fine concave and convex portions, and is in contact with the contact surface 611 of the first resin layer 6. Since the first conductor layer 7 is supported by the first resin layer 6 (specifically, the support portions 62), the contact surface 781 is positioned closer to the first resin layer 6 than the top surface 782. The concave-convex shape of the contact surface 781 is formed on the basis of the surface roughness of the contact surface 781. The surface roughness of the contact surface 781 will be described in detail below.

On the other hand, the top surface 782 is positioned on the side opposite to the contact surface 781. The top surface 782 faces third terminals 13 (to be described below) of the second wiring body 11 with the connection body 15 interposed therebetween. The top surface 782 includes a linear top surface-flat portion 7821. In the cross-section of the first conductor layer 7 taken in a width direction, the width of the top surface-flat portion 7821 is equal to or larger than the half of the width of the top surface 782. In this embodiment, substantially the entire top surface 782 forms the top surface-flat portion 7821. The flatness of the top surface-flat portion 7821 is set to 0.5 µm or less. Meanwhile, flatness can be defined by a JIS method (JIS B0621 (1984)).

The flatness of the top surface-flat portion 7821 is obtained by using a non-contact measurement method using a laser beam. Specifically, an object to be measured is irradiated with a band-shaped laser beam and the reflected light of the laser beam is made to form an image on an imaging element (for example, two-dimensional CMOS), so that flatness is measured. A method, which sets planes passing through three points spaced apart from each other as much as possible on a target flat surface and calculates the maximum value of a deviation between the planes as flatness, (the maximum deviation flatness) is used as a method of calculating flatness. Meanwhile, a method of measuring flatness and a method of calculating flatness are not particularly limited to the above-mentioned methods. For example, a method of measuring flatness may be a contact measurement method using a dial gauge or the like. Further, a method, which calculates the maximum value of a distance between planes parallel to each other when a target flat surface is interposed between the planes parallel to each other, (the maximum inclination flatness) may be used as a method of calculating flatness.

As illustrated in FIG. 6, the side surfaces 783 are interposed between the contact surface 781 and the top surface 782. One end portion 7831 of each of the side surfaces 783 is connected to the top surface 782, and the other end portion 7832 thereof is connected to the contact surface 781.

The side surfaces 783 and 783 are substantially flat surfaces inclined such that the side surfaces approach each other as being separated from the first resin layer 6 in cross-sectional view taken in the lateral direction. For this reason, the terminal conductor wire 78 is formed in a tapered shape that is narrowed as being separated from the first resin layer 6 in the cross-sectional view of the terminal conductor wire 78 taken in the lateral direction. The side surfaces 783 and 783 are continuous with the side surfaces of each support portion 62 of the first resin layer 6 that is to be in contact with the first conductor layer.

The side surface 783 includes a side surface-flat portion 7833 in the cross-section of the terminal conductor wire 78 taken in the width direction. The side surface-flat portion 7833 is a linear portion that is present on the side surface 783 in the cross-sectional view of the terminal conductor wire 78 taken in the lateral direction. The flatness of the side surface-flat portion 7833 is set to 0.5 µm or less. The side surface 783 of this embodiment is a surface extending on an imaginary straight line passing through both ends 7831 and 7832 of the side surface 783. Substantially the entire side surface 783 forms the side surface-flat portion 7833.

The shape of the side surface 783 is not particularly limited to the above-mentioned shape. For example, the side surface 783 may have the shape of an arc protruding outward in the cross-sectional view of the terminal conductor wire 78 taken in the lateral direction. In this case, the side surface 783 is present outside an imaginary straight line passing through both the ends 7831 and 7832 thereof. It is preferable that the side surface 783 has a shape in which the side surface 783 is not present inside an imaginary straight line passing through both ends thereof in the cross-sectional view of a fine wire taken in the lateral direction as described above. For example, it is preferable that the shape of the side surface is not the shape of an arc in which the side surface is concave toward the inside (that is, a shape in which the bottom of a fine wire is widened) in a case in which the width of the conductor wire is gradually increased as approaching the first resin layer in the cross-sectional view of the conductor wire in the lateral direction.

An angle $\theta$ between the side surface 783 and the top surface 782 is preferably within a range of 90° to 170° (90°≤$\theta$≤170°) and more preferably within a range of 90° to 120° (90°≤$\theta$≤120°). In this embodiment, an angle between one side surface 783 and the top surface 782 is substantially equal to an angle between the other side surface 783 and the top surface 782.

From the point of view of the strong fixation between the terminal conductor wire 78 and the first resin layer 6, it is preferable that the surface roughness of the contact surface 781 of the terminal conductor wire 78 of this embodiment is relatively higher than the roughness of the top surface 782. Since the top surface 782 includes the top surface-flat portion 7821 in this embodiment, a relative relationship of the surface roughness (a relationship in which the surface roughness of the top surface 782 is relatively higher than the surface roughness of the contact surface 781) is satisfied. Specifically, it is preferable that the surface roughness Ra of the contact surface 781 is within a range of about 0.1 µm to 3.0 µm but the surface roughness Ra of the top surface 782 is within a range of about 0.001 µm to 1.0 µm. Meanwhile, it is more preferable that the surface roughness Ra of the contact surface 781 is within a range of 0.1 µm to 0.5 µm, and it is still more preferable that the surface roughness Ra of the top surface 782 is within a range of 0.001 µm to 0.3 µm. Further, a relationship of the surface roughness of the top surface 782 relative to the surface roughness of the contact surface 781 is preferably equal to or larger than 0.01 and smaller than 1 and more preferably equal to or larger than 0.1 and smaller than 1. Furthermore, it is preferable that the surface roughness of the top surface 782 is equal to or smaller than ⅕ of the width (the maximum width) of the terminal conductor wire 78. Meanwhile, the surface roughness can be measured by a JIS method (JIS B0601 (amended on Mar. 21, 2013). The measurement of the surface roughness of the contact surface 781 and the surface roughness of the top surface 782 may be performed along the width direction of the terminal conductor wire 78 and may be performed along the extending direction of the terminal conductor wire 78.

Incidentally, the "surface roughness Ra" mentioned here means "arithmetic average roughness Ra" as disclosed in the JIS method (JIS B0601 (amended on Mar. 21, 2013). The "arithmetic average roughness Ra" means a roughness parameter obtained when a long-wavelength component (surge component) is blocked from a profile curve. The separation of a surge component from a profile curve is performed on the basis of measurement conditions (for example, the dimensions of an object, and the like) required to obtain a form.

In this embodiment, the side surface 783 also includes the side surface-flat portion 7833. For this reason, the surface roughness of the contact surface 781 is set to be relatively higher than the surface roughness of the side surface 783 as in the case of the top surface 782. The surface roughness Ra of the contact surface 781 is within a range of 0.1 µm to 3 µm, but the surface roughness Ra of the side surface 783 is preferably within a range of 0.001 µm to 1.0 µm and more preferably within a range of 0.001 µm to 0.3 µm. The measurement of the surface roughness of the side surface 783 may be performed along the width direction of the terminal conductor wire 78, and may be performed along the extending direction of the terminal conductor wire 78.

An example of the shape of a fine wire having a relative relationship between the surface roughness of the above-mentioned contact surface and the surface roughness of the surfaces except for the contact surface will be described with reference to FIG. 7. Some of conductive particles M protrude from a binder resin B on a contact surface 781B of a first conductor layer 7B, which is made of the conductive particles M and the binder resin B, in the cross-sectional view of a terminal conductor wire 78B taken in the lateral direction. Accordingly, the contact surface 781B has a concave-convex shape. Meanwhile, the binder resin B enters spaces between the conductive particles M on a top surface 782B and side surfaces 783B in the cross-sectional view of the terminal conductor wire 78B taken in the lateral direction. On the top surface 782B and the side surfaces 783B, some exposed portions of the conductive particles M are dotted but the binder resin B covers the conductive particles M. Accordingly, a linear top surface-flat portion 7821B is included in the top surface 782B, and linear side surface-flat portions 7833B are included on the side surfaces 783B. In this case, the surface roughness of the contact surface 781B is relatively higher than the surface roughness of the top surface 782B and is relatively higher than the surface roughness of the side surface 783B. Meanwhile, since the binder resin B covers the conductive particles M on the side surfaces 783B, electrical insulation between adjacent terminal conductor wires 78B is improved and the occurrence of migration is suppressed.

Meanwhile, the electrode conductor wire 711 of the first mesh-shaped electrode layer 71 has the same shape as the above-mentioned terminal conductor wire 78. For this reason, although not particularly illustrated, the surface roughness of the contact surface of the electrode conductor wire 711, which is in contact with the first resin layer 6, is set to be relatively higher than the surface roughness of each of the surfaces (the top surface and the side surfaces) thereof except for the contact surface. In a case in which a relative relationship between the surface roughness of the above-mentioned contact surface of the electrode conductor wire 711 and the surface roughness of each of the surfaces thereof except for the contact surface satisfies the above-mentioned relationship, the diffuse reflectance of each of the surfaces of the electrode conductor wire 711 except for the contact surface is lower than the diffuse reflectance of the contact surface thereof. Meanwhile, a ratio of the diffuse reflectance of each of the surfaces of the electrode conductor wire 711 of the first mesh-shaped electrode layer 71 except for the contact surface to the diffuse reflectance of the contact surface of the electrode conductor wire 711 of the first mesh-shaped electrode layer 71 is preferably equal to or larger than 0.1 and smaller than 1 and more preferably equal to or larger than 0.3 and smaller than 1.

The above-mentioned terminal conductor wire 78 is provided as the terminal conductor wire 78 of this embodiment as described below. As illustrated in FIG. 5, the terminal conductor wires 78a linearly extend in a direction (hereinafter, simply referred to as a "first direction") inclined at an angle of +45° with respect to the X direction, and the terminal conductor wires 78a are arranged at the same pitch $P_1$ in a direction (hereinafter, simply referred to as a "second direction") that is substantially orthogonal to the first direction.

In contrast, the terminal conductor wires 78b linearly extend in the second direction, and the terminal conductor wires 78b are arranged at the same pitch $P_2$ in the first direction. Further, since these terminal conductor wires 78a and 78b are orthogonal to each other, quadrangular (rhomboidal) openings 79 defined between the terminal conductor wires 78a and 78b are repeatedly arranged.

Incidentally, the structure of the first terminal 78 is not particularly limited to the above-mentioned structure. For example, the pitch $P_1$ of the terminal conductor wires 78a and the pitch $P_2$ of the terminal conductor wires 78b are substantially equal to each other ($P_1=P_2$) in this embodiment, but is not particularly limited thereto. The pitch $P_1$ of the terminal conductor wires 78a and the pitch $P_2$ of the terminal conductor wires 78b may be different from each other ($P_1 \neq P_2$). Further, the extending direction of the terminal conductor wire 78 can be arbitrarily set without being particularly limited to the above-mentioned direction. Furthermore, the terminal conductor wire 78 is formed in a linear shape in this embodiment, but is not particularly limited. For example, the terminal conductor wire 78 may be formed in a curved shape, the shape of a horseshoe, a zigzag shape, or the like.

In this embodiment, the terminal conductor wires 78a and 78b are orthogonal to each other so that the quadrangular openings 79 are formed in the first terminal 77. However, the shape of the opening 79 is not particularly limited thereto and various figure units can be used as the shape of the opening 79. For example, the shape of the opening 79 may be a triangular shape, such as an equilateral triangular shape, an isosceles triangular shape, or a right-angled triangular shape; a quadrangular shape, such as a rectangular shape, a square shape, a rhombic shape, the shape of a parallelogram, or a trapezoidal shape; a n-polygonal shape, such as a hexagonal shape, an octagonal shape, a dodecagonal shape, or an icosagon shape; a circular shape; an elliptical shape; a start shape; or the like. Further, the openings 79 have the same shape in this embodiment, but the shapes of the openings are not particularly limited thereto and openings having various shapes may be mixed according to the shapes and arrangement of the conductor wires.

The opening 79 can have a size corresponding to a function to be required. In this embodiment, the diameter $D_1$ of a circle inscribed in the opening 79 in plan view is preferably within a range of 500 nm to 50 μm and more particularly within a range of 1 μm to 30 μm. Furthermore, from the point of view of improvement of connection reliability between the first wiring body 5 and the second wiring body 11, a relationship between the diameter $D_1$ of a circle inscribed in the opening 79 and the diameter $D_2$ (see FIG. 10) of a conductive particle 152 (to be described below) of the connection body 15 is preferably set to satisfy the following Formula (3) and is more preferably set to satisfy the following Formula (4).

$$D_1 < D_2 \qquad (3)$$

$$D_1 \leq D_2 \times \tfrac{2}{3} \qquad (4)$$

Meanwhile, the diameter $D_1$ of a circle inscribed in the opening 79 of this embodiment corresponds to the shortest distance between the adjacent terminal conductor wires 78 in plan view (see FIG. 6).

Further, from the point of view of suppression of the outflow of conductive particles 152 from a position between the first and third terminals 77 and 13, it is preferable that the relationship between the diameter $D_1$ and the diameter $D_2$ is set to satisfy the following Formula (5).

$$D_2 \times \tfrac{1}{10} \leq D_1 \qquad (5)$$

As illustrated in FIG. 3, the second resin layer 8 is formed on the first resin layer 6 so as to cover the first conductor layer 7. Further, the second conductor layer 9 is formed on the second resin layer 8. As a result, the second resin layer 8 is interposed between the first conductor layer 7 and the second conductor layer 9 and has a function to ensure the insulation of the first conductor layer 7 and the second conductor layer 9. The second resin layer 8, which is interposed between the detection electrodes and the drive electrodes (that is, first and second mesh-shaped electrode layers 71 and 91), acts as a dielectric in the touch panel 1, and the sensitivity of the touch panel 1 is adjusted according to the thickness of the second resin layer 8.

The second resin layer 8 includes a main portion 81 that covers the first conductor layer 7 and a support portion 82 that is formed on the main portion 81. The support portion 82 is formed between the main portion 81 and the second conductor layer 9, and is formed so as to protrude in a direction in which the support portion 82 is away from the first resin layer 6 (an upward direction in FIG. 3).

The same material as the material of the first resin layer 6 can be exemplified as the material of the second resin layer 8. As in the case of the first resin layer 6, the storage modulus of the material of the second resin layer 8 at a temperature within a range of 130° C. to 200° C. is preferably 10 MPa or more and more preferably 20 MPa or more from the point of view of improvement of connection reliability between the first wiring body 5 (specifically, the second conductor layer 9) and the second wiring body 11.

In this embodiment, a notch 83 is formed on the second resin layer 8 to output detection signals, which are detected by the first mesh-shaped electrode layers 71 coated with the second resin layer 8, to the outside, and the second resin layer 8 is removed at the notch 83 by a size that allows the first terminals 77 to be collectively exposed to the outside.

As illustrated in FIG. 2, the second conductor layer 9 includes second mesh-shaped electrode layers 91, second lead-out wires 96, and second terminals 97. The second mesh-shaped electrode layers 91 are the drive electrodes of the touch panel 1. The second lead-out wires 96 and the second terminals 97 are to be provided to transmit drive signals, which are used to detect a touch position, (apply predetermined voltages) to the second mesh-shaped electrode layers 91.

Meanwhile, the basic structure of the second conductor layer 9 of this embodiment is the same as that of the above-mentioned first conductor layer 7. Accordingly, in the following description, portions of the structure of the second conductor layer 9, which are different from the structure of the first conductor layer 7, will be described in detail and the detailed description of other basic structure of the second conductor layer 9 will be omitted since other basic structure of the second conductor layer 9 is the same as that of the first conductor layer 7.

As illustrated in FIG. 2, the second conductor layer 9 of this embodiment includes four second mesh-shaped electrode layers 91 that extend in the X direction in substantially parallel to each other. The second mesh-shaped electrode layers 91 are disposed so as to face the first mesh-shaped electrode layers 71 through the second resin layer 8 in plan view. Accordingly, as in the case of the first mesh-shaped electrode layers 71, the second mesh-shaped electrode layers 91 are provided so as to correspond to the transparent portion 31 of the cover panel 3.

As illustrated in FIG. 2, the second lead-out wires 96 are provided so as to correspond to the second mesh-shaped electrode layers 91. In this embodiment, four second lead-out wires 96 are formed for four second mesh-shaped electrode layers 91. One end portion of the second lead-out wire 96 is led from each of the second mesh-shaped electrode layers 91 through a lead portion 961.

In this embodiment, the second lead-out wires 96, which correspond to two second mesh-shaped electrode layers 91 positioned on the side corresponding to +Y direction, are led from the sides of the second mesh-shaped electrode layers 91 corresponding to −X direction. Meanwhile, the second lead-out wires 96, which correspond to the other second mesh-shaped electrode layers 91 (that is, two second mesh-shaped electrode layers 91 positioned on the side corresponding to −Y direction), are led from the sides of the second mesh-shaped electrode layers 91 corresponding to +X direction. These second lead-out wires 96 extend while portions of these second lead-out wires 96, which overlap the blocking portion 32 of the cover panel 3 in plan view, are bent; and connect the second mesh-shaped electrode layers 91 to the second terminals 97. Meanwhile, a position at which the lead portion 961 is provided is not particularly limited on the outer edge of the second mesh-shaped electrode layer 91. Further, the second lead-out wire 96 is connected to the second mesh-shaped electrode layer 91 through the lead portion 961 in this embodiment. The invention is not particularly limited thereto and the second lead-out wire 96 and the second mesh-shaped electrode layer 91 may be directly connected to each other.

As illustrated in FIG. 2, (a total of four) second terminals 97 are formed at the other end portions of the second lead-out wires 96, respectively. The second terminals 97 are provided so as to correspond to the blocking portion 32 of the cover panel 3, are positioned near the outer edge of the first wiring body corresponding to −Y direction, and are arranged together with the first terminals 77 in plan view. The second terminals 97 (two second terminals 97 in this embodiment), which are connected to the second lead-out wires 96 led from the sides of the second mesh-shaped electrode layers 91 corresponding to −X direction, are positioned on the side of the three arranged first terminals 77 corresponding to −X direction. The second terminals 97 (two second terminals 97 in this embodiment), which are led from the sides of the second mesh-shaped electrode layers 91 corresponding to +X direction, are positioned on the side of the three arranged first terminals 77 corresponding to +X direction. Meanwhile, the first and second terminals 77 and 97 are disposed so as to be arranged in the X direction in plan view, but the second terminals 97 are disposed so as to deviate upward from the first terminals 77 in a Z direction according to the thickness of the second resin layer 8 (see FIG. 9).

As in the case of the first conductor layer 7, the second mesh-shaped electrode layers 91, the second lead-out wires 96, and the second terminals 97 of the second conductor layer 9 are integrally formed. Further, as in the case of the first conductor layer 7, each of the second mesh-shaped electrode layers 91, the second lead-out wires 96, and the second terminals 97 is formed in the shape of a mesh in which conductor wires having conductivity cross each other. In this embodiment, the mesh structure of the first conductor layer 7 and the mesh structure of the second conductor layer 9 are substantially the same (that is, the shapes and arrangement of the conductor wires of the first and second conductor layers 7 and 9 are substantially the same). However, a relationship between the mesh structure of the first conductor layer 7 and the mesh structure of the second conductor layer 9 is not particularly limited to the above-mentioned relationship. That is, the mesh structure of the first conductor layer 7 and the mesh structure of the second conductor layer 9 may be different from each other. For example, the mesh of the second conductor layer 9 may be rougher than the mesh of the first conductor layer 7. Alternatively, the mesh of the second conductor layer 9 may be finer than the mesh of the first conductor layer 7. The adjustment of the meshes of the first and second conductor layers 7 and 9 can be performed by the change of the shapes of the conductor wires (for example, the widths of the conductor wires) of the first and second conductor layers 7 and 9 and the arrangement of the conductor wires (for example, a pitch of the conductor wires adjacent to each other).

Meanwhile, each of the second terminals 97 includes terminal conductor wires 98 that are arranged in the shape of a mesh, and openings 99 are defined since the terminal conductor wires 98 cross each other. Although the shape of the second terminal 97 is different from the shape of the first terminal 77 to some extent, the basic structure of the second terminal 97 is the same as that of the first terminal 77. Accordingly, in this specification, in FIGS. 5 and 6, the first lead-out wires 76 and the first terminals 77 of the first conductor layer 7 are illustrated, corresponding reference numerals of the second lead-out wires 96 and the second terminals 97 of the second conductor layer 9 are put in the parentheses, and the second lead-out wires 96 and the second terminals 97 of the second conductor layer 9 are not illustrated.

Incidentally, a relationship between the diameter $D_3$ of a circle inscribed in the opening 99 of the second terminal 97 and the diameter $D_2$ of the conductive particle 152 of the connection body 15 is also preferably set to satisfy the following Formula (6) as in the case of the Formula (3), is more preferably set to satisfy the following Formula (7) as in the case of the Formula (4), and is still more preferably set to satisfy the following Formula (8) as in the case of the Formula (5).

$$D_3 < D_2 \quad (6)$$

$$D_3 \leq D_2 \times \tfrac{2}{3} \quad (7)$$

$$D_2 \times \tfrac{1}{10} \leq D_3 \quad (8)$$

The third resin layer 10 has a function as a protective layer protecting the second conductor layer 9 from the outside. As illustrated in FIG. 3, the third resin layer 10 is formed on the second resin layer 8 so that the second conductor layer 9 is interposed between the third resin layer 10 and the second resin layer 8. Meanwhile, since the second conductor layer 9 is covered with the third resin layer 10, the occurrence of scattering and the like of light on the surface of the first wiring body 5 can be suppressed. The third resin layer 10 can be made of the same material as the first resin layer 6.

The third resin layer 10 is substantially uniformly formed so as to also include upper portions of connecting portions between the first wiring body 5 and the second wiring bodies 11 in this embodiment, but is not particularly limited thereto. For example, notches may be formed at a part of the third resin layer so that the second wiring bodies are exposed to the outside. Further, a resin layer, which is different from the third resin layer and covers the exposed second wiring bodies from above, may be further provided.

As illustrated in FIG. 1, second wiring bodies 11a, 11b, and 11c are flexible printed circuit boards used to electrically connect the first wiring body 5 to an external circuit (not illustrated). In this embodiment, the second wiring body 11a is electrically connected to the first conductor layer 7 and the second wiring bodies 11b and 11c are electrically connected to the second conductor layer 9. Meanwhile, in the following description, the second wiring bodies are simply represented as "second wiring bodies 11" in a case in which the second wiring bodies are collectively referred, and the second wiring bodies are represented together with reference numerals denoting the respective second wiring bodies in a case in which the respective second wiring bodies need to be distinguished.

As illustrated in FIG. 8, the second wiring body 11 includes a base 12, third terminals 13 provided on the base 12, and wires 14 electrically connected to the third terminals 13. The base 12 is a band-shaped member, and is made of, for example, a film material, such as polyethylene terephthalate (PET), polyethylene naphthalate (PEN), polyamide resin (PI), or a polyetherimide resin (PEI).

The third terminals 13 are provided so as to correspond to the first terminals 77 and the second terminals 97. The second wiring body 11a is provided with three third terminals 13a that make pairs together with the three first terminals 77, respectively. Meanwhile, the second wiring body 11b is provided with two third terminals 13b that make pairs together with the two second terminals 97, respectively, and the second wiring body 11c is provided with two third terminals 13c that make pairs together with the two second terminals 97, respectively. Meanwhile, the "third terminals 13a", the "third terminals 13b", and the "third terminals 13c" are collectively referred to as the above-mentioned "third terminals 13".

One end portion of each of the wires 14 is electrically connected to each of the third terminals 13, and the other end portion thereof is electrically connected to an external circuit (not illustrated). The third terminals 13 and the wires 14 may be integrally formed, and may be formed so as to have different compositions. For example, electrolytic copper foil, rolled copper foil, and the like can be used as the third terminals 13 and the wires 14. Meanwhile, the third terminals 13 and the wires 14 may be made of the same material as the material of the above-mentioned first conductor layer 7. Meanwhile, "wires 14a", "wires 14b", and "wires 14c" are illustrated in FIG. 8, and are collectively referred to as "wires 14".

As illustrated in FIG. 9, the connection bodies 15 have a function to join the first wiring body 5 to the second wiring body 11 and to conduct electricity (electrically connect) between the first and second wiring bodies 5 and 11. An anisotropic conductive material in which conductive particles 152 are dispersed in a resin material 151 (binder resin) can be used for the connection bodies 15. An anisotropic conductive film (ACF), anisotropic conductive paste (ACP), and the like can be exemplified as a specific example of the anisotropic conductive material.

The connection structure between the first and second wiring bodies 5 and 11 will be described in detail below using connection between the first terminal 77 and the third terminal 13a as an example. In this embodiment, the first and second wiring bodies 5 and 11 are connected to each other by thermocompression bonding, and these wiring bodies 5 and 11 are fixed to each other in a state in which the connection body 15 is interposed between the first terminal 77 and the third terminals 13a as illustrated in FIG. 10. In this case, the resin material 151 acts to join the first wiring body 5 to the second wiring body 11. Meanwhile, conductive particles 152, which are interposed between the first and third terminals 77 and 97a, act to be in contact with both the terminals 77 and 97a and to conduct electricity between both the terminals 77 and 97a. Meanwhile, an insulating state is maintained at a portion to which pressure is not applied.

In this embodiment, the connection body 15 is in a gap between the terminal conductor wires 78 of the first terminal 77. Specifically, some of the conductive particles 152 of the connection body 15 enter the gap between the terminal conductor wires 78, and regions between the terminal conductor wires 78 crossing each other are filled with the resin material 151 forming the connection body 15. Further, at least a part of the resin material 151 forming the connection body 15 is in contact with the first resin layer 6 that are exposed from the gap between the terminal conductor wires 78.

A thermosetting resin, a thermoplastic resin, a mixed resin thereof, and the like can be used as the resin material 151 forming the connection body 15. Specifically, resin materials, such as an epoxy resin, a phenolic resin, a urethane resin, an acrylic resin, a silicone resin, a polyester resin, and a polyamide resin, can be exemplified as the resin material 151 forming the connection body 15. Fine particles made of metal, such as silver, copper, and nickel; resin fine particles (resin core) coated with the metal; carbon; or the like can be used as the conductive particles 152 of the connection body 15. An acrylic resin, a styrene resin, and the like can be used as the resin core.

The diameter of the conductive particle 152 can be set according to a function to be required. The diameter of the conductive particle 152 is preferably within a range of, for example, 3 µm to 100 µm and more preferably within a range of 5 µm to 50 µm. Further, in, this embodiment, from the point of view of improvement of connection reliability between the first wiring body 5 and the second wiring body 11, the diameter of the conductive particle 152 is preferably set to satisfy the Formula (1) and is more preferably set to satisfy the Formula (2).

Meanwhile, the diameter of the conductive particle 152 means the arithmetic mean value (average particle size) of the diameters of the conductive particles 152 before thermocompression bonding (an unloaded state). The average particle size of the conductive particles 152 is measured as described below. That is, the particle sizes of a plurality of (at least ten) conductive particles 152 are measured using a scanning electron microscope (SEM), and the arithmetic mean value thereof is obtained. In this case, when the shape of the conductive particle 152 is the shape of an ellipsoid having a minor axis and a major axis, the shape of a rod, or a shape including the concept of an aspect ratio, a side (or a diameter) in the longitudinal direction is measured as the diameter of the conductive particle 152. When the diameter of the conductive particle 152 is measured, aggregated conductive particles and conductive particles having distorted contours are excluded from the object to be measured. Incidentally, the aggregated conductive particles mean conductive particles that adhere to each other in the shape of a flake.

Further, from the point of view of improvement of connection reliability between the first wiring body 5 and the second wiring body 11, it is preferable that a relationship between a distance $L_1$ between the first and third terminals 77 and 13a, which make a pair, and the diameter $D_2$ of the conductive particle 152 is set to satisfy the following Formula (9) as illustrated in FIG. 10. Here, in a case in which the shape of the conductive particle 152 is the shape of an ellipsoid having a minor axis and a major axis, the shape of a rod, or a shape including the concept of an aspect ratio, a length in the lateral direction is measured as an object.

$$L_1 \leq D_2 \times 0.7 \quad (9)$$

Meanwhile, the connection structure between the first and third terminals 77 and 13a has been described above. Although the shape of the connection structure between the second and third terminals 97 and 13b (13c) is different from that of the connection structure between the first and third terminals 77 and 13a to some extent, the basic structures thereof are the same. Accordingly, in FIG. 10, the first terminals 77 and the third terminals 13a are illustrated, corresponding reference numerals of the second terminals 97 and the third terminals 13b (13c) are put in the parentheses, and the second terminals 97 and the third terminals 13b (13c) are not illustrated.

The connection structure between the second and third terminals 97 and 13b (13c) will be described in brief. As in the case of the first and third terminals 77 and 13a, conductive particles 152, which are interposed between the second and third terminals 97 and 13b (13c), act to be in contact with both the terminals 97 and 13b (13c) and to conduct electricity between both the terminals 97 and 13b (13c). From the point of view of the improvement of connection reliability between the first wiring body 5 and the second wiring body 11, the conductive particles 152 are preferably set to satisfy the Formula (6) and are more preferably set to satisfy the Formula (7). Further, it is preferable that a relationship between a distance $L_2$ between the second and third terminals 97 and 13b (13c), which make a pair, and the diameter $D_2$ of the conductive particle 152 is set to satisfy the following Formula (10).

$$L_2 \leq D_2 \times 0.7 \quad (10)$$

As illustrated in FIG. 9, the transparent adhesive layer 16 is used to attach the first wiring body 5 to the cover panel 3. Publicly known adhesives, such as an acrylic resin-based adhesive, a urethane resin-based adhesive, and a polyester resin-based adhesive, can be used as the transparent adhesive layer 16, but it is preferable that a material having a total light transmittance of 90% or more is used as the transparent adhesive layer 16.

In the structure 2 of this embodiment, the transparent adhesive layer 16 is interposed between the cover panel 3 and the third resin layer 10. In this case, since the electrode conductor wires 711 are disposed so that the relatively flat surface of the contour of each of the electrode conductor wires 711 of the first mesh-shaped electrode layers 71 faces the cover panel 3, the occurrence of the scattering and the like of incident light, which is incident from the cover panel 3, can be suppressed.

Next, a method of manufacturing the structure 2 of this embodiment will be described in detail with reference to FIGS. 11(a) to 11(e), FIGS. 12(a) to 12(h), and FIGS. 13(a) to 13(c). FIGS. 11(a) to 11(e), FIGS. 12(a) to 12(h), and FIGS. 13(a) to 13(c) are cross-sectional views illustrating a method of manufacturing the structure with a conductor layer according to an embodiment of the invention.

Meanwhile, in order to illustrate the method of manufacturing the structure 2 of this embodiment so that the method is easily understood, the first mesh-shaped electrode layers 71, the first lead-out wires 76, and the first terminals 77 of the first conductor layer 7 are simply illustrated in FIGS. 11(a) to 11(e), FIG. 12(a), FIGS. 12(d) to 12(h), FIG. 13(b), and FIG. 13(c). However, actually, each of the first mesh-shaped electrode layers 71, the first lead-out wires 76, and the first terminals 77 is formed in the shape of a mesh by using conductor wires. Likewise, the second mesh-shaped electrode layers 91, the second lead-out wires 96, and the second terminals 97 of the second conductor layer 9 are simply illustrated in FIGS. 12(b) to 12(h), FIG. 13(b), and FIG. 13(c). However, actually, each of the second mesh-shaped electrode layers 91, the second lead-out wires 96, and the second terminals 97 is formed in the shape of a mesh by using conductor wires.

Figure 11:
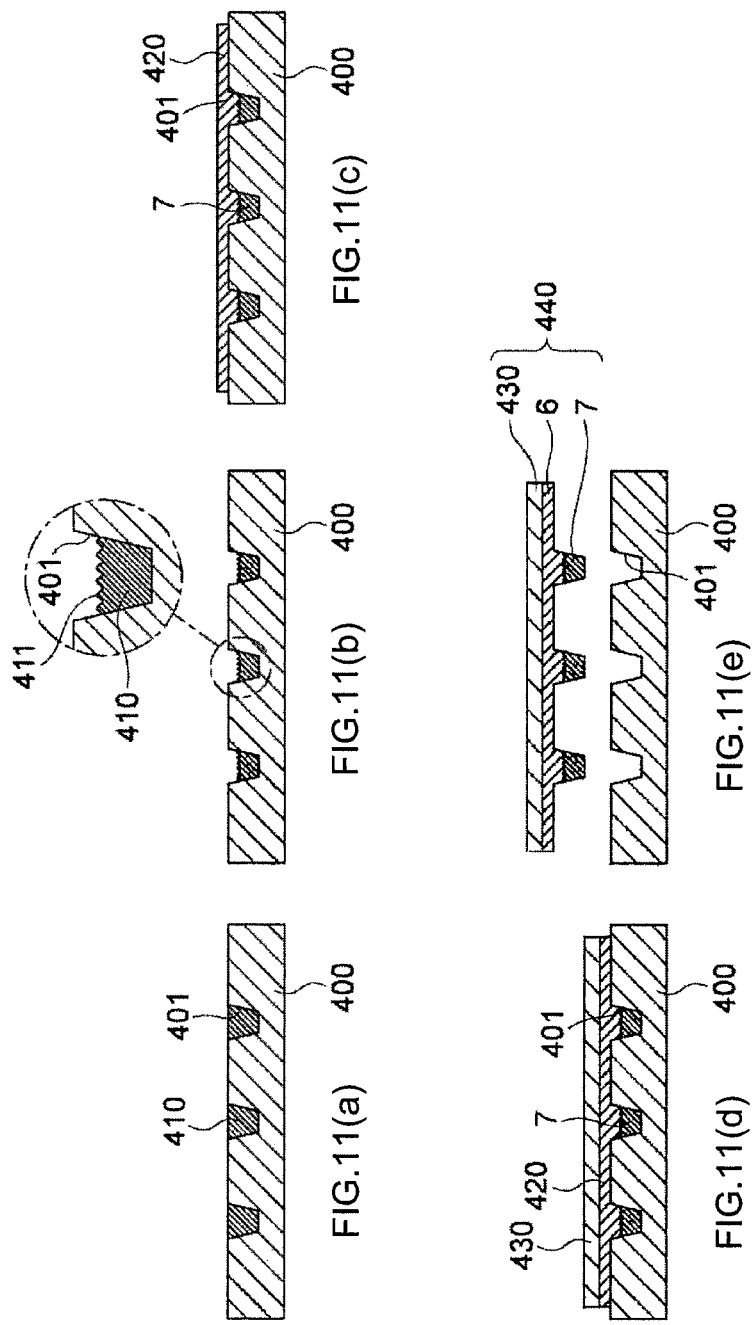
FIGS. 11(a) to 11(e) are cross-sectional views illustrating (the first part of) a method of manufacturing a structure with a conductor layer according to an embodiment of the invention.

First, intaglio 400 on which recessed portion 401 having a shape corresponding to the shape of the first conductor layer 7 are formed as illustrated in FIG. 11(a) is prepared. Glass, such as nickel, silicon, and silicon dioxide; organic silica; glassy carbon; a thermoplastic resin; a photocurable resin; and the like can be exemplified as the material of the intaglio 400.

The width of each of the recessed portion 401, which correspond to the electrode conductor wires 711, among the recessed portion 401 is preferably within a range of 50 nm to 1000 µm, more preferably within a range of 500 nm to 150 µm, still more preferably within a range of 1 µm to 10 µm, and yet more preferably within a range of 1 µm to 5 µm. Further, the depth of each of the recessed portion 401, which correspond to the electrode conductor wires 711, among the recessed portion 401 is preferably within a range of 50 nm to 3000 µm, more preferably within a range of 500 nm to 450 µm, and still more preferably within a range of 500 nm to 10 µm. Meanwhile, the width of each of the recessed portion 401, which correspond to the terminal conductor wires 78, among the recessed portion 401 is preferably within a range of 1 µm to 1000 µm, more preferably within a range of 1 µm to 150 µm, still more preferably within a range of 5 µm to 50 µm, and yet more preferably within a range of 5 µm to 30 µm. Further, the depth of each of the recessed portion 401, which correspond to the terminal conductor wires 78, among the recessed portion 401 is preferably within a range of 1 µm to 3000 µm, more preferably within a range of 1 µm to 450 µm, and still more preferably within a range of 1 µm to 150 µm. In this embodiment, the cross-sectional shape of the recess 401 is a tapered shape that is narrowed toward the bottom. Meanwhile, it is preferable that a release layer (not illustrated), which is made of a graphite-based material, a silicone-based material, a fluorine-based material, a ceramic-based material, an aluminum-based material, or the like, is formed on the surfaces of the recessed portion 401 in advance to give releasability to the surfaces of the recessed portion 401.

The recessed portion 401 of the intaglio 400 are filled with a conductive material 410. The above-mentioned conductive paste is used as the conductive material 410.

Examples of a method of filling the recessed portion 401 of the intaglio 400 with the conductive material 410 can include a dispensing method, an ink jet method, and a screen printing method. Alternatively, examples of the method of filling the recessed portion 401 of the intaglio 400 with the conductive material 410 can include a method of wiping off or scraping off a conductive material coated on portions other than the recessed portion 401, a method of sucking the conductive material, a method of attaching and removing the conductive material, a method of washing off the conductive material, and a method of blowing off the conductive material after coating in a slit-coating method, a bar-coating method, a blade-coating method, a dip-coating method, a spray-coating method, and a spin-coating method. The methods can be appropriately selected and used according to the composition of the conductive material, the shape of the intaglio, or the like.

Next, the conductive material 410, which is filled in the recessed portion 401 of the intaglio 400, is heated to form the first conductor layer 7 as illustrated in FIG. 11(b). Heating conditions of the conductive material 410 can be appropriately set according to the composition of the conductive material or the like. Due to this heating treatment, the volume of the conductive material 410 contracts and a concave-convex shape is slightly formed on a surface 411 of the conductive material 410. At this time, the outer surfaces of the conductive material 410 except for an upper surface are shaped in a shape corresponding to the recess 401.

Meanwhile, a method of treating the conductive material 410 is not limited to heating. The conductive material 410 may be irradiated with an energy ray, such as infrared light, ultraviolet light, or laser light, and may be merely dried. Further, two or more kinds of these methods may be combined. Since the contact area between the first conductor layer 7 and the first resin layer 6 is increased by the concave-convex shape of the surface 411, the first conductor layer 7 can be more firmly fixed to the first resin layer 6.

Next, as illustrated in FIG. 11(c), a resin material 420 is applied onto the intaglio 400 (the intaglio 400 that is in a state of FIG. 11(b)) on which the first conductor layer 7 is formed. The material of the above-mentioned first resin layer 6 is used as the resin material 420. A screen printing method, a spray-coating method, a bar-coating method, a dipping method, an ink jet method, a casting method, and the like can be exemplified as a method of applying the resin material 420 onto the intaglio 400.

After that, as illustrated in FIG. 11(d), a support base 430 is disposed on the intaglio 400 so that the resin material 420 enters the recessed portion 401 of the intaglio 400, the support base 430 is pushed against the intaglio 400, and the resin material 420 is hardened. As long as the support base 430 has a certain degree of stiffness, the support base 430 is not particularly limited. For example, polyethylene terephthalate (PET), a polyolefin film, polyvinyl chloride (PVC), polyethylene (PE), polypropylene (PP), polystyrene (PS), and the like can be exemplified as the support base 430. Irradiation of an energy ray, such as ultraviolet light, infrared light, or laser light, heating, heating and cooling, drying, and the like can be exemplified as a method of hardening the resin material 420. As a result, the first resin layer 6 is formed.

Incidentally, a method of forming the first resin layer 6 is not particularly limited to the above-mentioned method. For example, in order to form the first resin layer 6, a support base 430 onto which the resin material 420 used to form the first resin layer 6 is substantially uniformly applied may be prepared and the resin material 420 may be hardened in a state in which the support base 430 is pushed against the intaglio 400 so that the resin material 420 enters the recessed portion 401 of the intaglio 400.

Next, the support base 430, the first resin layer 6, and the first conductor layer 7 are integrally released from the intaglio 400 as illustrated in FIG. 11(e). Hereinafter, a body in which the support base 430, the first resin layer 6, and the first conductor layer 7 are integrated is also referred to as a first intermediate 440.

Figure 12:
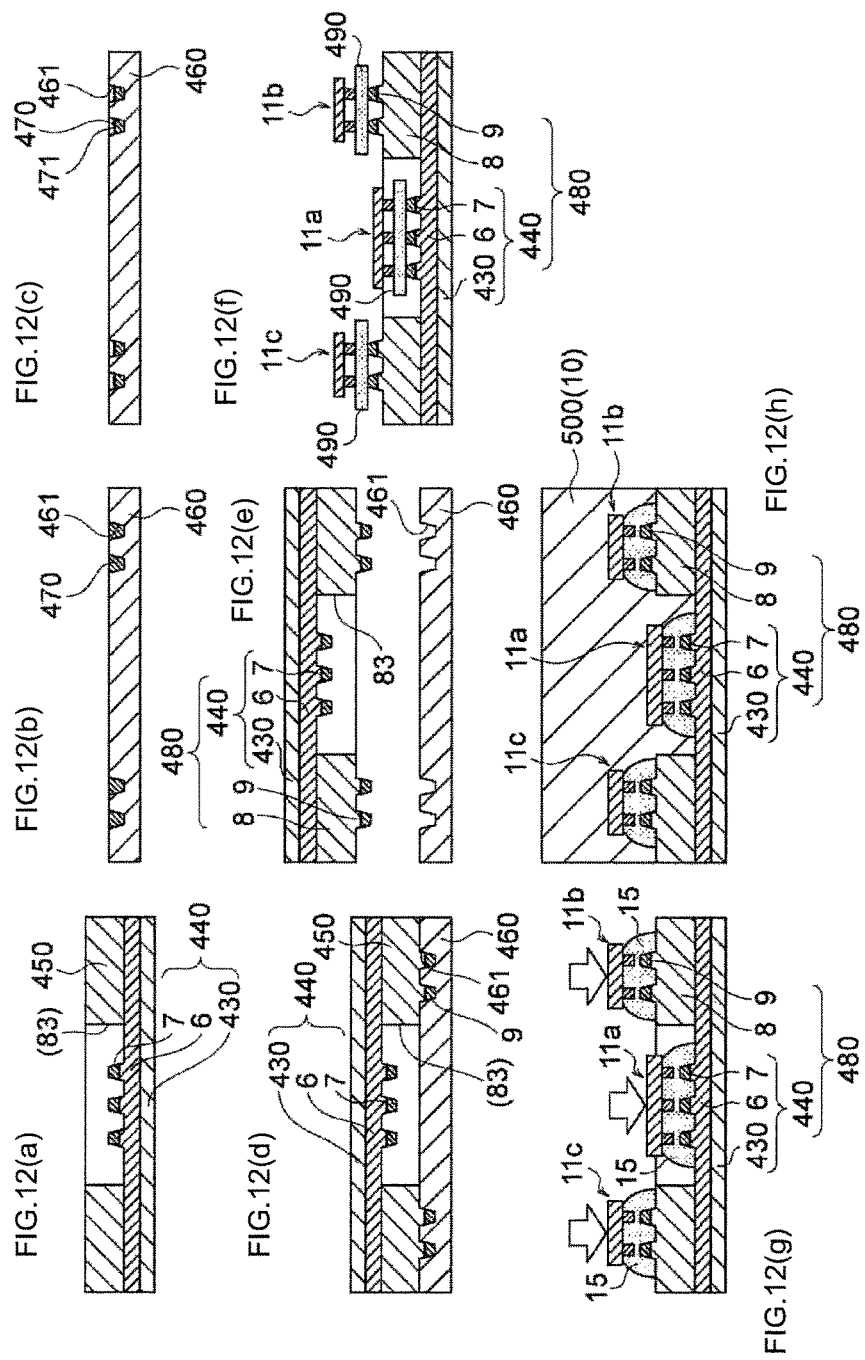
FIGS. 12(a) to 12(h) are cross-sectional views illustrating (the second part of) the method of manufacturing a structure with a conductor layer according to the embodiment of the invention.

After that, as illustrated in FIG. 12(a), a resin material 450, which forms the second resin layer 8, is applied onto the first intermediate 440. The same material as the above-mentioned resin material 420 can be used as the resin material 450. Further, the same method as the method of applying the above-mentioned resin material 420 can be exemplified as a method of applying the resin material 450. In this embodiment, a portion (denoted by reference numeral (83) in FIGS. 12(a) and 12(d)) corresponding to the notch 83 is formed in a step of applying the resin material 450. Specifically, the resin material 450 is patterned and applied so that the notch 83 is formed. Meanwhile, a method of forming the formation of the notch 83 is not particularly limited thereto. After a uniform resin layer on which a portion corresponding to the notch 83 is not formed is formed, the resin layer may be partially cut to form the notch 83.

Next, an intaglio 460 on which recessed portion 461 having a shape corresponding to the shape of the second conductor layer 9 are formed as illustrated in FIG. 12(b) is prepared. The same material as the material of the above-mentioned intaglio 400 can be used as the material of the intaglio 460. Further, it is preferable that the recessed portion 461 have the same shape as the above-mentioned recess 401 since the basic structure of the first conductor layer 7 is the same as that of the second conductor layer 9.

Then, the recessed portion 461 of the intaglio 460 are filled with a conductive material 470. The same material as the above-mentioned conductive material 410 can be used as the conductive material 470. Further, the same method as the method of filling the recessed portion 401 of the intaglio 400 with the above-mentioned conductive material 410 can be used as a method of filling the recessed portion 461 of the intaglio 460 with the conductive material 470.

Next, the conductive material 470, which is filled in the recessed portion 461 of the intaglio 460, is heated to form the second conductor layer 9 as illustrated in FIG. 12(c). Heating conditions of the conductive material 470 can be appropriately set according to the composition of the conductive material or the like. Due to this heating treatment, the volume of the conductive material 470 contracts and a concave-convex shape is slightly formed on a surface 471 of the conductive material 470. At this time, the outer surfaces of the conductive material 470 except for an upper surface are shaped in a shape corresponding to the recess 461. Since the contact area between the second conductor layer 9 and the second resin layer 8 is increased by the uneven shape of the surface 471, the second conductor layer 9 can be more firmly fixed to the second resin layer 8. Meanwhile, various methods, which have been exemplified as the method of treating the above-mentioned conductive material 410, can be used as a method of treating the conductive material 470.

After that, as illustrated in FIG. 12(d), the first intermediate 440 is disposed on the intaglio 460 so that the resin material 450 enters the recessed portion 461 of the intaglio 460, and the first intermediate 440 is pushed against the intaglio 460. Then, the resin material 450 is hardened to form the second resin layer 8. The same method as the method of hardening the above-mentioned resin material 420 can be used as a method of hardening the resin material 450.

Next, the second resin layer 8, the second conductor layer 9, and the first intermediate 440 are integrally released from the intaglio 460 as illustrated in FIG. 12(e). Hereinafter, a body in which the second resin layer 8, the second conductor layer 9, and the first intermediate 440 are integrated is also referred to as a second intermediate 480.

After that, as illustrated in FIG. 12(f), an ACF 490 is disposed on three first terminals 77 and an ACF 490 is disposed on each of two concentrated second terminals 97 in the second intermediate 480. The ACF 490 is made of the same material as the material of the above-mentioned connection body 15.

Then, a second wiring body 11a is disposed through the ACF 490 so as to correspond to the concentrated first terminals 77, and second wiring bodies 11b and 11c are disposed through the ACFs 490 so as to correspond to the concentrated second terminals 97. Meanwhile, the ACFs 490 have been separately disposed so as to correspond to the first and second terminals 77 and 97 in this embodiment. However, the invention is not particularly limited thereto, and an ACF, which is uniformly formed, may be disposed on the first and second terminals.

Next, as illustrated in FIG. 12(g), while heat is applied to the ACFs 490 in a state in which the ACFs 490 are interposed between the second intermediates 480 and the second wiring bodies 11, the second wiring bodies 11 are pushed toward the second intermediates 480 and thermocompression bonding is performed. Meanwhile, thermocompression bonding for the second intermediate 480 and the second wiring body 11a, thermocompression bonding for the second intermediate 480 and the second wiring body 11b, and thermocompression bonding for the second intermediate 480 and the second wiring body 11c are independently performed. A temperature condition and a pressure condition at the time of thermocompression bonding are appropriately set according to the compositions of the second intermediate 480 and the second wiring body 11, or the like. After thermocompression bonding is performed, the ACFs 480 are hardened to form the connection bodies 15. The connection bodies 15 join the second intermediates 480 to the second wiring bodies 11, and conduct electricity between the first and third terminals 77 and 13a and between the second and third terminals 97 and 13b (13c).

After that, as illustrated in FIG. 12(h), a resin material 500 is applied onto the second conductor layer 9. The material of the above-mentioned third resin layer 10 is used as the resin material 500.

Meanwhile, from the point of view of ensuring sufficient fluidity at the time of application, it is preferable that the viscosity of the resin material 500 is within a range of 1 mPa·s to 10000 mPa·s. Further, from the point of view of the durability of the second conductor layer 9, it is preferable that the storage modulus of the hardened resin is within a range of $10^6$ Pa to $10^9$ Pa. A screen printing method, a spray-coating method, a bar-coating method, a dipping method, an ink jet method, a casting method, and the like can be exemplified as a method of applying the resin material 500.

When the resin material 500 is applied, ends of the second wiring bodies 11 are embedded in the resin material 500. Further, the applied resin material 500 flows into the notch 83. Then, the resin material 500 is hardened to form the third resin layer 10. Irradiation of an energy ray, such as ultraviolet light, infrared light, or laser light, heating, heating and cooling, drying, and the like can be exemplified as a method of hardening the resin material 500.

Figure 13:
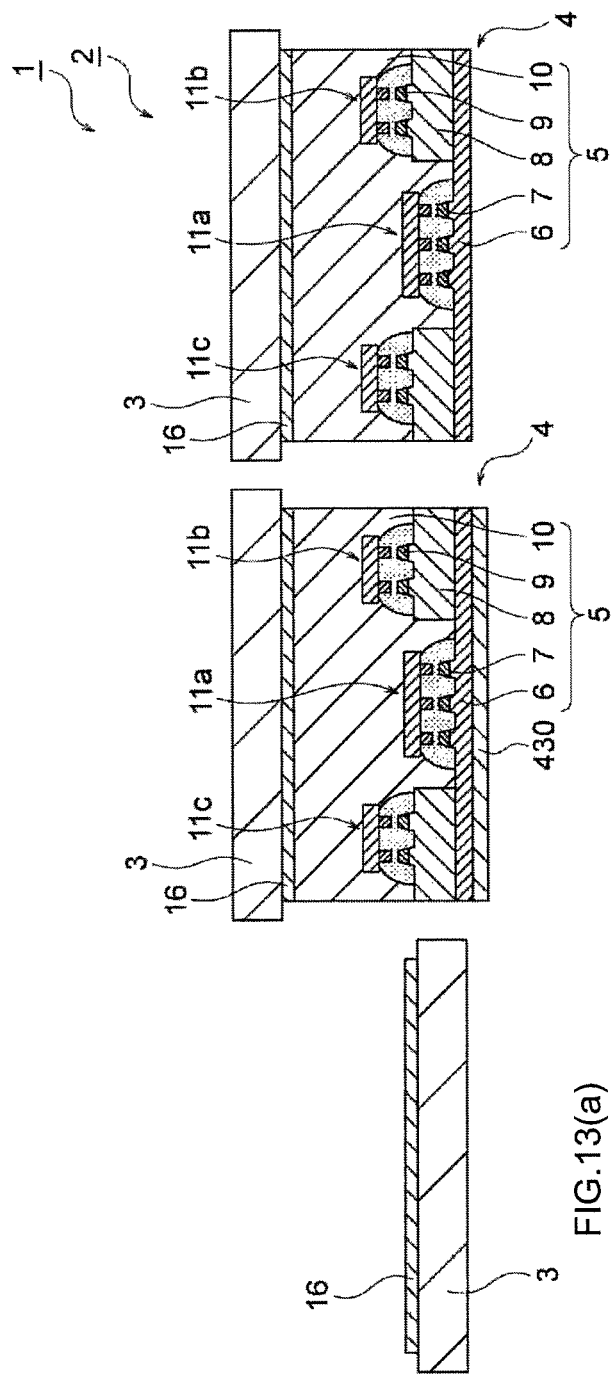
FIGS. 13(a) to 13(c) are cross-sectional views illustrating (the third part of) the method of manufacturing a structure with a conductor layer according to the embodiment of the invention.

Next, a transparent adhesive layer 16 is formed on the cover panel 3, which is prepared in advance, as illustrated in FIG. 13(a). At this time, an adhesive material having fluidity may be applied onto the cover panel 3 and may be hardened to form the transparent adhesive layer 16, and a sheet-like adhesive material may be attached onto the cover panel 3 to form the transparent adhesive layer 16. In a case in which an adhesive material having fluidity is used as the transparent adhesive layer, the adhesive material can be applied by a screen printing method, a spray-coating method, a bar-coating method, a dipping method, an ink jet method, a casting method, or the like. Meanwhile, irradiation of an energy ray, such as ultraviolet light, infrared light, or laser light, heating, heating and cooling, drying, or the like may be performed in a case in which the transparent adhesive layer needs to be hardened.

After that, as illustrated in FIG. 13(b), one exposed surface of the first wiring body 5 is pushed against the cover panel 3 through the transparent adhesive layer 16 so that the first wiring body 5, the transparent adhesive layer 16, and the cover panel 3 adhere to each other. Then, the support base 430 provided on the other surface of the first wiring body 5 is removed as illustrated in FIG. 13(c). Accordingly, the structure 2 (the touch panel 1) can be obtained.

Next, an action will be described.

Figure 14:
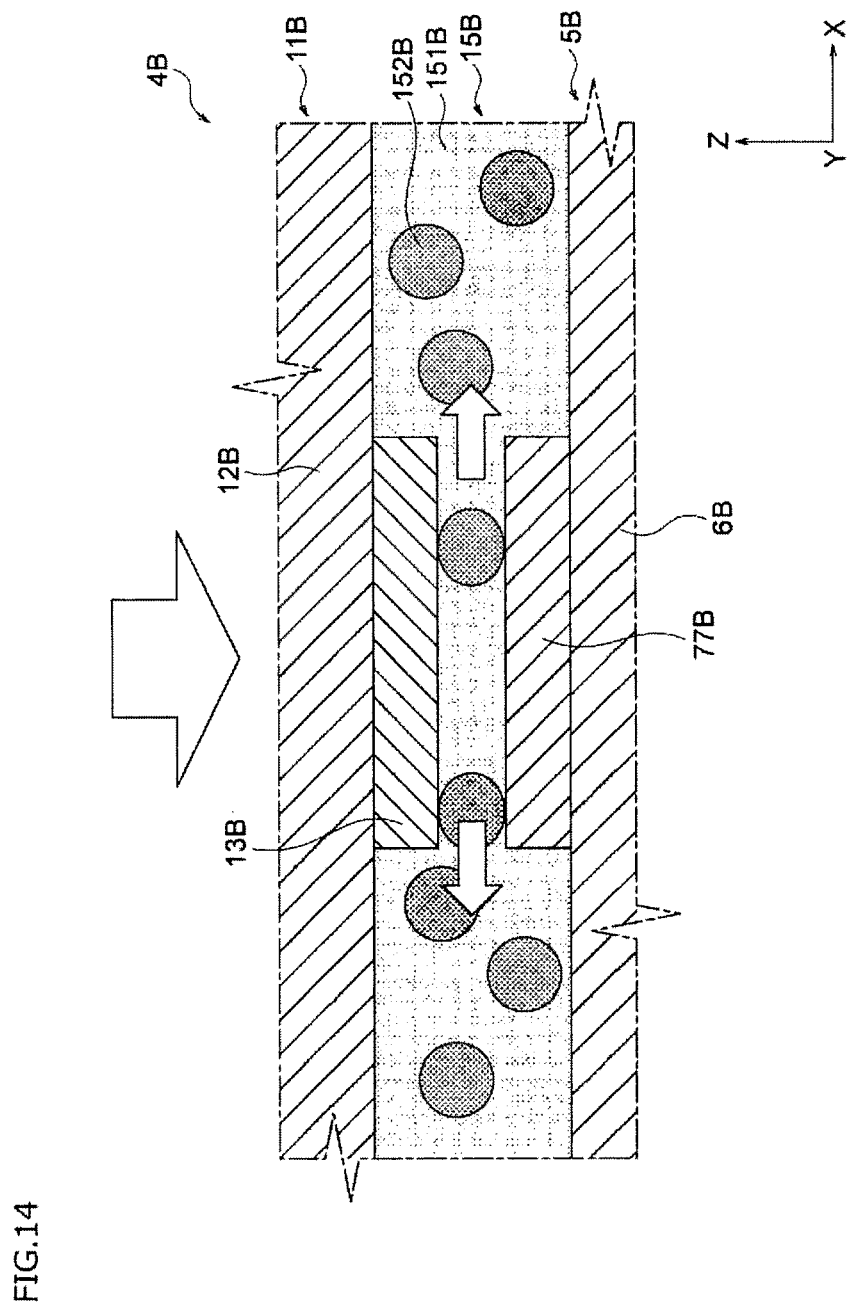
FIG. 14 is a cross-sectional view illustrating the action of a wiring body assembly according to Comparative Example.
Figure 15:
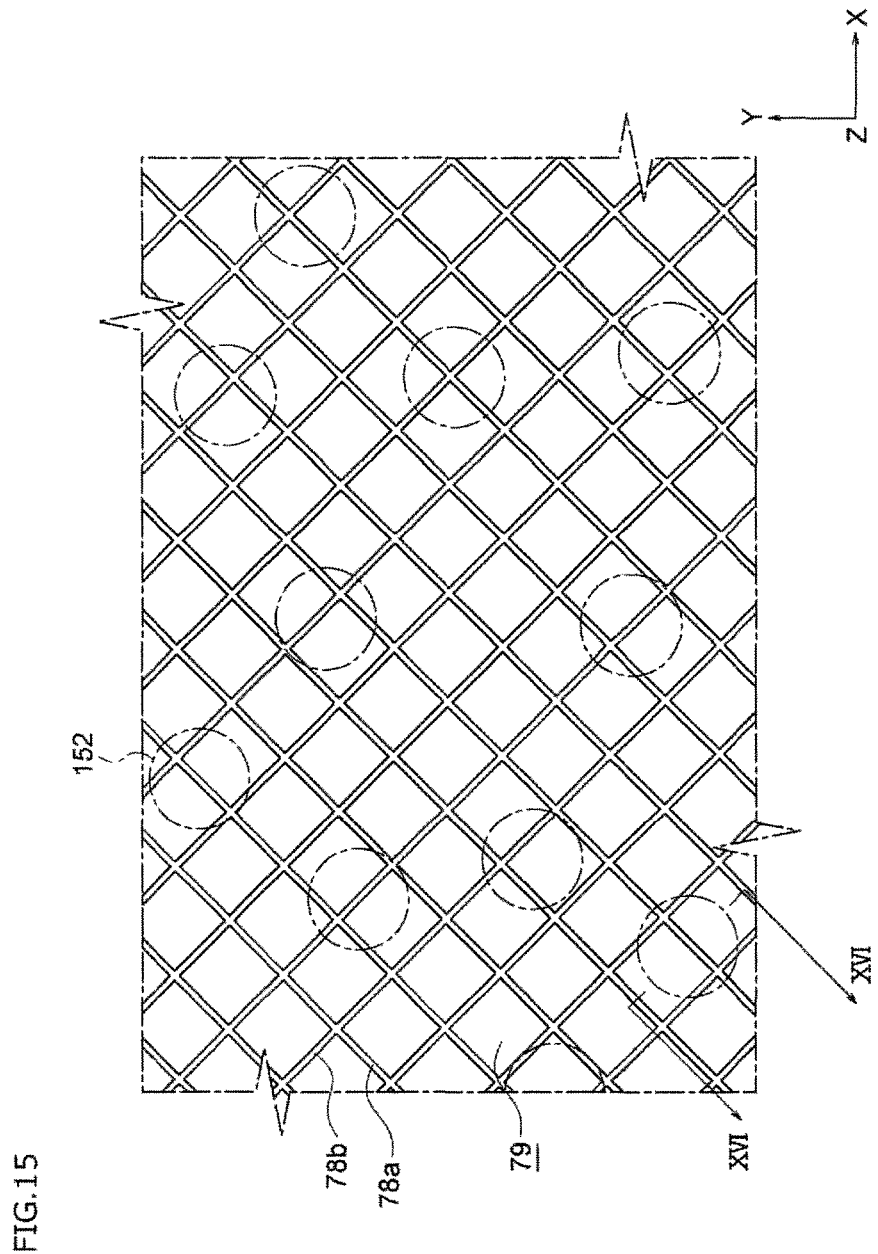
FIG. 15 is a plan view illustrating the action (first action) of a wiring body assembly according to an embodiment of the invention.
Figure 16:
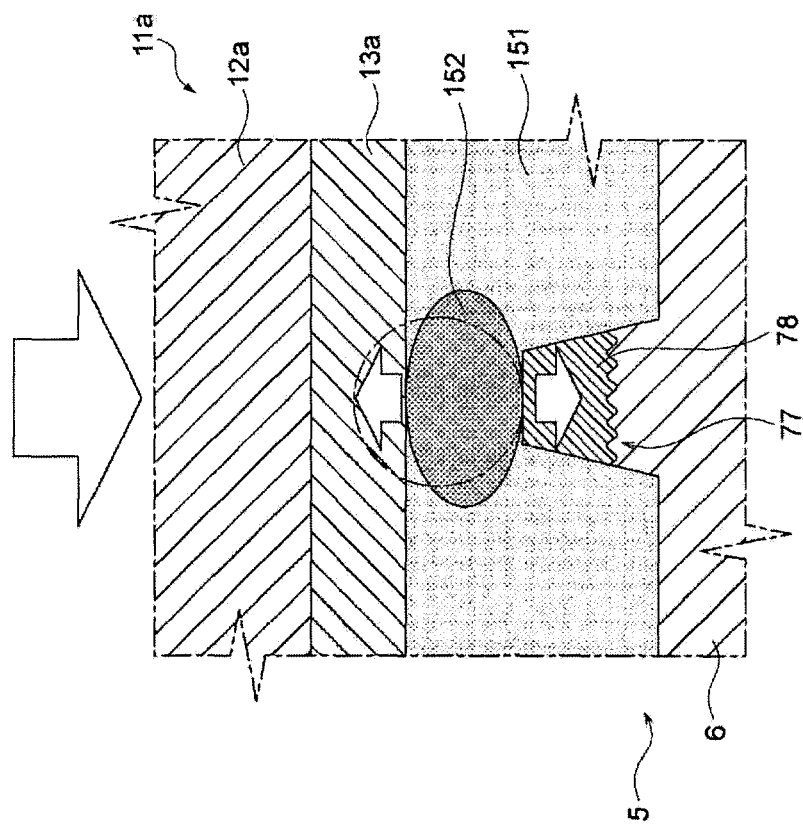
FIG. 16 is a view illustrating the action (second action) of the wiring body assembly according to the embodiment of the invention and is a cross-sectional view taken along line XVI-XVI of FIG. 15.

FIG. 14 is a cross-sectional view illustrating the action of a wiring body assembly according to Comparative Example, FIG. 15 is a plan view illustrating the action (first action) of the wiring body assembly according to the embodiment of the invention, and FIG. 16 is a view illustrating the action (second action) of a wiring body assembly according to the embodiment of the invention and is a cross-sectional view taken along line XVI-XVI of FIG. 15.

As illustrated in FIG. 14, in a wiring body assembly 4B according to Comparative Example, first and second wiring bodies 5B and 11B are connected to each other through a connection body 15B in which conductive particles 152B are dispersed in a resin material 151B, and a terminal 77B provided on a first resin layer 6B and a terminal 13B provided on a base 12B are disposed so as to correspond to each other. In the wiring body assembly 4B, the terminal 77B is formed in a solid pattern. For this reason, in a step of performing thermocompression bonding, conductive particles 152B contained in the connection body 15B are likely to flow out of a portion between the terminals 77B and 13B while the second wiring body 11B is pressed against the first wiring body 5B. Accordingly, the amount of the conductive particles 152B interposed between the terminals 77B and 13B is reduced. Since the number of conduction paths is reduced between the first wiring body 5B and the second wiring body 11B in this state, there is a concern that electrical connection reliability between the first and second wiring bodies 5B and 11B may deteriorate.

In contrast, in this embodiment, the terminal conductor wires 78 of the first terminal 77 are arranged in the shape of a mesh as illustrated in FIG. 10. Since many conductive particles 152 of the connection body 15 can be caught by the mesh in this embodiment, many conductive particles 152 can be interposed between the first and second terminals 77 and 13a. Accordingly, connection reliability between the first and second wiring bodies 5 and 11 is improved.

Further, in this embodiment, the connection body 15 is supported by the mesh-shaped first terminal 77. For this reason, since the connection body 15 is caught by the mesh of the first terminal 77 even though a force is applied to the first or second wiring body 5 or 11 in a direction crossing the arrangement direction of the first and second wiring bodies 5 and 11, the first and second wiring bodies 5 and 11 are firmly connected to each other. Accordingly, the relative movement of the first and second wiring bodies 5 and 11 is suppressed, so that a connection state is likely to be maintained. Therefore, connection reliability between the first and second wiring bodies 5 and 11 is further improved.

Furthermore, the connection body 15 enters the gap between the terminal conductor wires 78 of the first terminal 77 in this embodiment. For this reason, the misalignment of the first and second wiring bodies 5 and 11 can be suppressed in a case in which a force is applied in a direction crossing the arrangement direction of the first and second wiring bodies 5 and 11. Accordingly, connection reliability between the first and second wiring bodies 5 and 11 can be further improved.

Further, since the contact area between the first terminal 77 and the conductive particles 152 is increased when the first terminal 77 is formed in the shape of a mesh in this embodiment, the electrical resistance between the first terminal 77 and the conductive particles 152 can be reduced.

Furthermore, since a relationship between the diameter $D_1$ of a circle inscribed in the opening 79 of the first terminal 77 and the diameter $D_2$ of the conductive particle 152 is set to satisfy the Formula (3) in this embodiment, it is possible to prevent the conductive particles 152 from entering the openings 79 as illustrated in FIG. 15. In this case, when the second wiring body 11 is pressed against the first wiring body 5 as illustrated in FIG. 16, a pressing force to be transmitted through the third terminal 13a acts so as to deform (elastically deform) the conductive particle 152 interposed between the first and third terminals 77 and 13a. For this reason, the contact area between the first terminal 77 and the conductive particle 152 is increased, and the contact area between the third terminal 13 and the conductive particle 152 is increased. Further, the repulsive force of the deformed conductive particle 152, which is to be restored to the original shape, is applied to the first and third terminals 77 and 13a (the conductive particle 152 in an unloaded state is illustrated by a one-dot chain line). Accordingly, a firm connection state between the first and third terminals 77 and 13a is likely to be maintained. When the conductive particles 152 are prevented from entering the openings 79 as described above, connection reliability between the first and second wiring bodies 5 and 11 is further improved.

In addition, when the Formula (4) is satisfied, the action is more noticeable. Further, since a sufficient repulsive force caused by the deformation of the conductive particle 152 is obtained when the Formula (9) is satisfied, connection reliability between the first and second wiring bodies 5 and 11 is further improved.

Furthermore, in this embodiment, each of the terminal conductor wires 78 of the first terminals 77 faces the third terminal 13 through the connection body 15 and includes the substantially flat top surface 782 having a linear shape in cross-sectional view taken in the lateral direction. For this reason, in comparison with a case in which the conductor wire is formed to be round, it is difficult for the conductive particle 152 to escape from a space between the first and third terminals 77 and 13 and the conductive particle 152 can be more reliably interposed between the first and third terminals 77 and 13. Further, since a large contact area between the terminal conductor wire 78 and the conductive particle 152 can be ensured, electricity can be likely to be conducted between the terminal conductor wire 78 and the conductive particle 152.

Furthermore, in this embodiment, each terminal conductor wire 78 includes the contact surface 781 formed in a concave-convex shape. For this reason, since the first resin layer 6 and the first terminal 77 can be made to firmly adhere to each other, it is possible to make it difficult for the terminal conductor wire 78 to be broken even though a force is applied in a direction crossing the arrangement direction of the first and second wiring bodies 5 and 11.

Moreover, when the storage modulus of the material of the first resin layer 6 at a temperature within a range of 130° C. to 200° C. is set to 10 MPa or more in this embodiment, the depression of the first resin layer is suppressed in a case in which the second wiring body 11 is pressed against the first wiring body 5 at the time of thermocompression bonding. Meanwhile, a temperature condition within a range of 130° C. to 200° C. corresponds to a temperature condition at the time of the thermocompression bonding of the first and second wiring bodies 5 and 11. Accordingly, since the dispersion of a force is suppressed, the conductive particles 152 can be sufficiently deformed. Consequently, connection reliability between the first and second wiring bodies 5 and 11 is further improved.

Further, in this embodiment, the surface roughness of the contact surface of the electrode conductor wire 711, which is in contact with the first resin layer 6, of the first mesh-shaped electrode layer 71 is set to be relatively higher than the surface roughness of each of the surfaces (surfaces including the top surface and the side surfaces) thereof except for the contact surface. For this reason, the first resin layer 6 and the first mesh-shaped electrode layer 71 can firmly adhere to each other, and the diffused reflection of light incident from the outside can be suppressed. Particularly, when a relative relationship between the surface roughness of the contact surface of the electrode conductor wire 711 and the surface roughness of each of the surfaces thereof except for the contact surface satisfies the above-mentioned relationship in a case in which the width of the electrode conductor wire 711 is within a range of 1 μm to 5 μm, effects of making the first resin layer 6 and the first mesh-shaped electrode layer 71 firmly adhere to each other and suppressing the diffused reflection of light incident from the outside can be made noticeable.

Furthermore, in this embodiment, the side surface of the electrode conductor wire 711 extends so as to substantially correspond to an imaginary straight line passing through both ends of the side surface. In this case, since a part of the side surface of the electrode conductor wire 711 is not formed in a shape in which a part of the side surface is not present inside an imaginary straight line passing through both ends thereof in the cross-section of the electrode conductor wire 711 taken in the width direction, the diffused reflection of light incident from the outside of the first wiring body 5 is suppressed. Accordingly, the visibility of the first wiring body 5 can be improved.

Further, when the surface roughness Ra of the contact surface of the electrode conductor wire 711 is set to be relatively higher than the surface roughness Ra of each of the surfaces (surfaces including the top surface and the side surfaces) thereof except for the contact surface in this embodiment, the diffuse reflectance of each of the surfaces thereof except for the contact surface is relatively lower than the diffuse reflectance of the contact surface. Here, when the diffuse reflectance of the first wiring body 5 is low, a phenomenon that the electrode conductor wire 711 is reflected as white is suppressed. Accordingly, the deterioration of contrast can be suppressed in a region in which the electrode conductor wire 711 can be visually recognized. In this way, the visibility of the first wiring body 5 of this embodiment can be further improved.

Incidentally, in a case in which the resin material 151 forming the connection body 15 is a thermoplastic resin, it is preferable that a temperature condition at the time of thermocompression bonding is within a range of a temperature that is equal to or higher than the melting temperature of the resin material 151, is equal to or lower than the melting temperature of a peripheral member (250° C. or less in the case of a general PET film), and is equal to or lower than the softening temperatures (glass transition temperature) of the first and third terminals 77 and 13a. On the other hand, it is preferable that a temperature condition at the time of thermocompression bonding is within a range of a temperature that is equal to or higher than the hardening temperature of the resin material 151, is equal to or lower than the melting temperature of a peripheral member (250° C. or less in the case of a general PET film), and is equal to or lower than the softening temperatures (glass transition temperature) of the first and third terminals 77 and 13a in a case in which the resin material 151 is a thermosetting resin.

In a case in which the resin material 151 is a thermoplastic resin, the glass transition temperature of the resin material 151 is obtained by a viscoelasticity determination device (trade name: EXSTAR DMS6100, manufactured by SII NanoTechnology Inc.), and means temperature representing the maximum value of tan δ obtained from the plotting of tan δ, which is a ratio (G"/G') of loss modulus G" to storage modulus G', with respect to temperature after a measurement sample, which is cut from the resin material 151 so as to have a sample size corresponding to a length of 40 mm and a width of 10 mm, is set on a jig for film tensile measurement and measurement is performed under conditions of a temperature in the measured temperature range of −50 to 250° C., a frequency of 1 Hz, a strain of 0.2% or less, and a rate of temperature increase of 2° C./min.

On the other hand, in a case in which the resin material 151 is a thermosetting resin, the hardening temperature of the resin material 151 means a temperature at which the resin material 151 causes cross-linking reaction.

Meanwhile, the above-mentioned action and effects are revealed when the second wiring body 11a and the first conductor layer 7 of the first wiring body 5 are connected to each other. The first wiring body 5 of this embodiment includes the first and second conductor layers 7 and 9, and the second conductor layer 9 has the same structure as the first conductor layer 7. Accordingly, the same action and effects as the above-mentioned action and effects can also be obtained in a case in which the second wiring bodies 11b and 11c and the second conductor layer 9 of the first wiring body 5 are connected to each other.

The "second wiring body 11" of this embodiment corresponds to an example of a "second wiring body" of the invention. However, in regard to the "second wiring body 11a" as a reference, the "first resin layer 6" of this embodiment corresponds to an example of a "support layer" of the invention, the "first conductor layer 7" of this embodiment corresponds to an example of a "conductor layer" of the invention, the "first terminal 77" of this embodiment corresponds to an example of a "first terminal" of the invention, the "terminal conductor wire 78" of this embodiment corresponds to an example of a "conductor wire" of the invention, the "opening 79" of this embodiment corresponds to an example of an "opening" of the invention, the "third terminal 13a" of this embodiment corresponds to an example of a "second terminal" of the invention, and the "top surface 782" of this embodiment corresponds to an example of a "surface" of the invention.

On the other hand, in regard to the "second wiring body 11b" and the "second wiring body 11c" as a reference, the "second resin layer 8" of this embodiment corresponds to an example of a "support layer" of the invention, the "second conductor layer 9" of this embodiment corresponds to an example of a "conductor layer" of the invention, the "second terminals 97" of this embodiment corresponds to an example of a "first terminal" of the invention, the "terminal conductor wire 98" of this embodiment corresponds to an example of a "conductor wire" of the invention, the "opening 99" of this embodiment corresponds to an example of an "opening" of the invention, the "third terminal 13b" and the "third terminal 13c" of this embodiment correspond to an example of a "second terminal" of the invention, and the "top surface 782" of this embodiment corresponds to an example of a "surface" of the invention.

Meanwhile, the above-mentioned embodiment is described to facilitate the understanding of the invention, and does not limit the invention. Accordingly, the respective elements disclosed in the embodiment also include all design changes or equivalents belonging to the scope of the invention.

For example, the touch panel 1 of this embodiment is a projection-type electrostatic capacitive touch panel sensor including two conductor layers, but is not particularly limited thereto. The invention can also be applied to a surface-type (capacitive coupling) electrostatic capacitive touch panel sensor including one conductor layer.

Further, for example, a metal material or a carbon-based material has been used as the conductive material (conductive powder) forming the first and second conductor layers 7 and 9 in this embodiment. However, the conductive material (conductive powder) is not particularly limited to a metal material or a carbon-based material and a mixture of a metal material and a carbon-based material may be used as the conductive material (conductive powder). In this case, in regard to the terminal conductor wire 78 as an example, a carbon-based material may be disposed on the top surface 782 of the terminal conductor wire 78 and a metal material may be disposed on the contact surface 781. On the contrary, a metal material may be disposed on the top surface 782 of the terminal conductor wire 78 and a carbon-based material may be disposed on the contact surface 781.

Furthermore, the first and second mesh-shaped electrode layers 71 and 91, which are formed in the shape of a mesh in which conductor wires having conductivity cross each other, have been provided as the electrodes, which has translucency, of the touch panel 1 in this embodiment, but the electrodes, which has translucency, of the touch panel 1 are not limited to the first and second mesh-shaped electrode layers 71 and 91. The electrodes of the touch panel 1 may be made of ITO (indium tin oxide), which is a material having translucency, or a conductive polymer.

Figure 17:
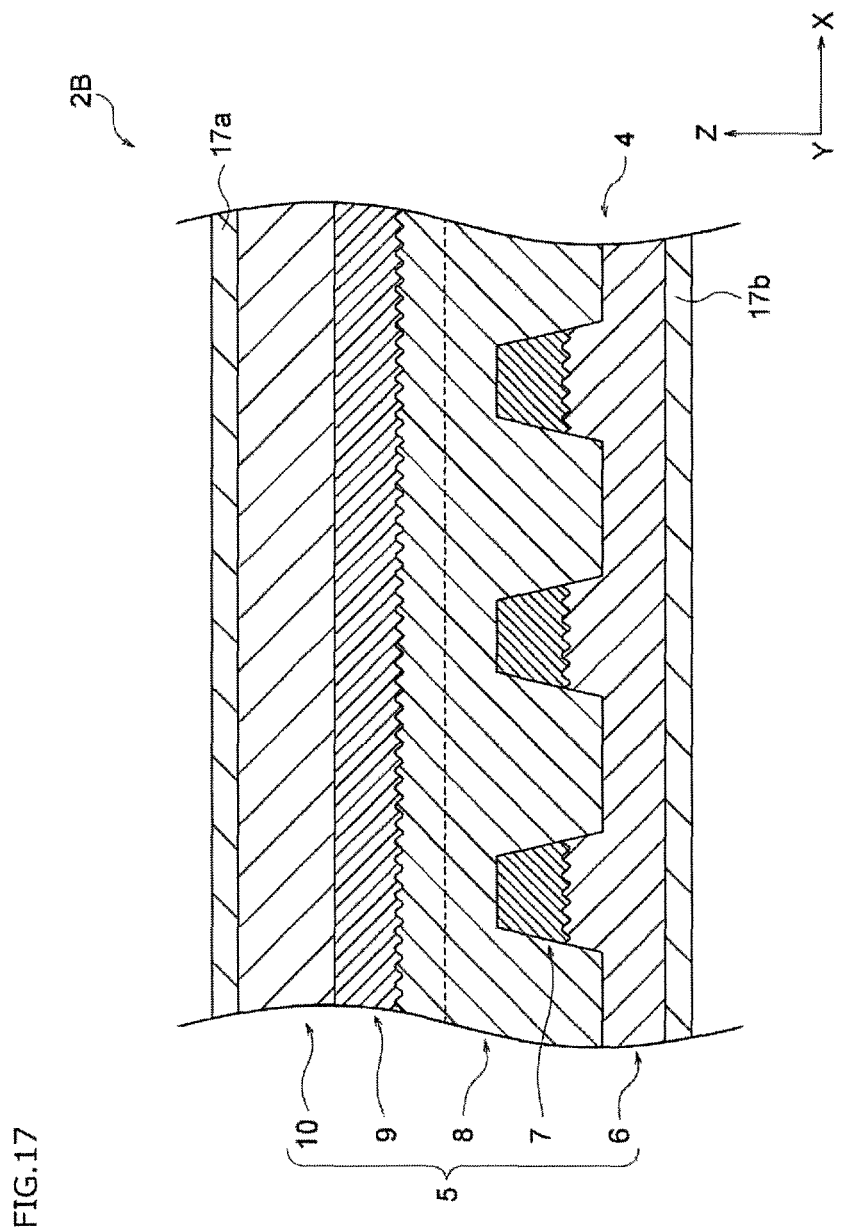
FIG. 17 is a cross-sectional view illustrating a modification of the structure with a conductor layer according to the embodiment of the invention.
Figure 18:
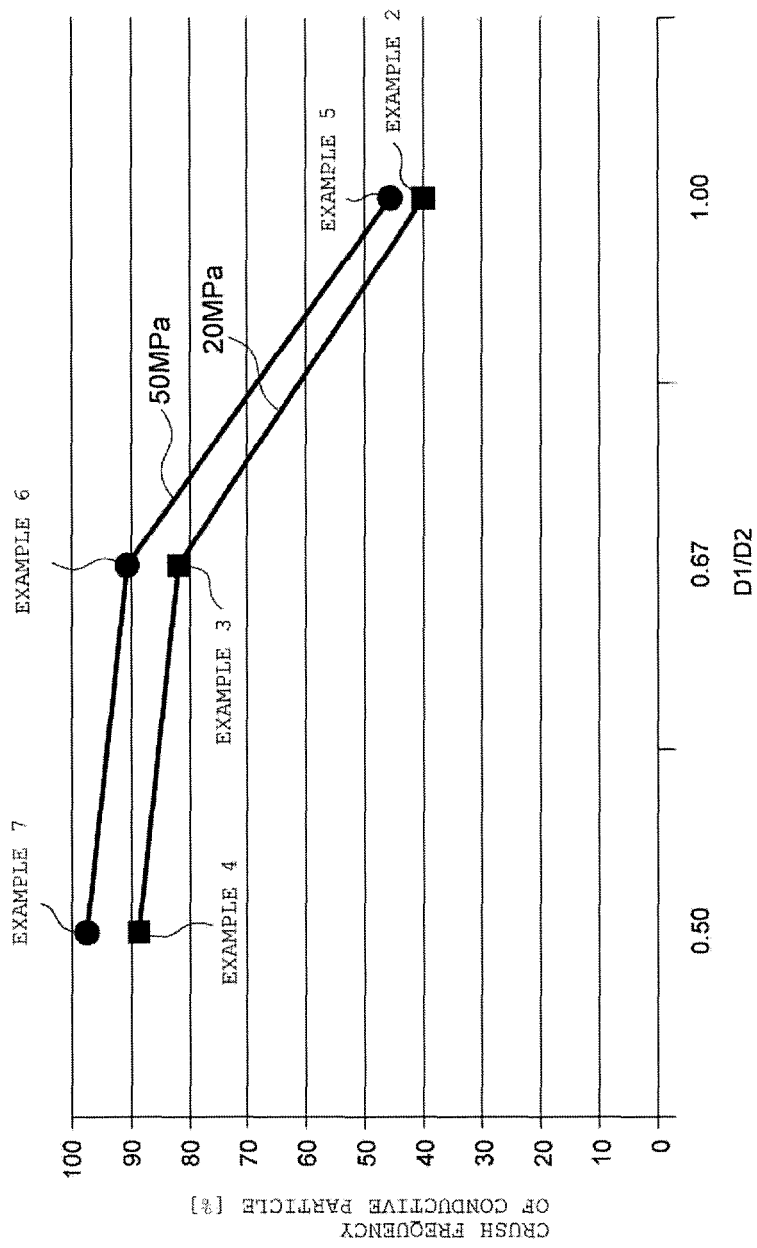
FIG. 18 is a graph illustrating the action of a wiring body assembly according to an embodiment of the invention.

Further, as illustrated in FIG. 17, a structure 2B with a conductor layer (hereinafter, also simply referred to as a structure 2B) may include a wiring body assembly 4 and protective bases 17a and 17b covering both main surfaces of a first wiring body 5 of the wiring body assembly 4. FIG. 17 is a cross-sectional view illustrating a modification of the structure with a conductor layer according to the embodiment of the invention.

The structure 2B is to be used to convey the wiring body assembly 4, and the wiring body assembly 4 can be used for various uses after the protective bases 17a and 17b are separated from the first wiring body 5. In this modification, damage to both the main surfaces of the first wiring body 5 is prevented by the protective bases 17a and 17b when the wiring body assembly 4 is conveyed.

Film-like members in which various additives or fillers are added to, for example, polyethylene terephthalate (PET), a polyolefin film, polyvinyl chloride (PVC), polyethylene (PE), polypropylene (PP), polystyrene (PS), or the like can be used as the protective bases 17a and 17b. Meanwhile, the protective bases 17a and 17b are to be used to convey the wiring body assembly 4 as described above, and do not affect a function of the wiring body assembly 4 since being separated later. Accordingly, as long as the protective bases 17a and 17b can protect both the main surfaces of the first wiring body 5, the material of the protective bases 17a and 17b is not limited to the above-mentioned materials and more inexpensive materials may be used as the material of the protective bases 17a and 17b. The "structure 2B with a conductor layer" of this embodiment corresponds to an example of a "structure with a conductor layer" of the invention, and the "protective base 17a" and the "protective base 17b" of this embodiment correspond to an example of a "support" of the invention.

Further, the above-mentioned structure 2 with a conductor layer has included the transparent adhesive layer 16 that allows the first wiring body 5 and the cover panel 3 to adhere to each other, but the transparent adhesive layer 16 may be omitted and the third resin layer 10 of the first wiring body 5 may be formed as a transparent adhesive layer.

Further, a wiring body with a conductor layer has been used in a touch panel in the above-mentioned embodiment, but the use of the wiring body with a conductor layer is not particularly limited to the touch panel. For example, when current flows in the first wiring body and heat is generated by resistance heating or the like, the first wiring body may be used as a heater. In this case, it is preferable that a carbon-based material of which the value of electrical resistance is relatively high is used as conductive powder. Furthermore, when a part of the conductor layer of the first wiring body is grounded, the first wiring body may be used as an electromagnetic shield. Moreover, the first wiring body may be used as an antenna. In this case, a mounting target on which the first wiring body is mounted corresponds to an example of a "support" of the invention; and the heater, which includes the first wiring body and the mounting target, the electromagnetic shield, and the antenna correspond to an example of a "structure with a conductor layer" of the invention.

EXAMPLES

The effects of the invention were confirmed using Examples and Comparative Example of the invention. Examples and Comparative Example to be described below were to confirm an effect of improving connection reliability between the first and second wiring bodies of the wiring body assembly of the above-mentioned embodiment.

Example 1

An example of the wiring body assembly will be described below.

A first wiring body, a second wiring body, and an ACF were prepared in Example 1. In the second wiring body, an adhesive layer made of an epoxy resin was formed on a base made of a polyamide resin and having a thickness of 35 µm, and third terminals having a thickness of 35 µm and a width of 250 µm were formed on the adhesive layer at an interval of 250 µm. A nickel-aluminum (Ni/Au) plating layer was stacked on the surface of copper (Cu) foil to form the third terminal. Meanwhile, in the first wiring body, a first resin layer made of an acrylic resin and having a thickness of 50 µm was formed on PET having a thickness of 75 µm. An acrylic resin having a storage modulus of 20 MPa at a temperature within a range of 130 to 200° C. was used as the acrylic resin. First terminals, which were made of silver (Ag) paste and had a thickness of 5 µm and a width of 250 µm, was formed on the first resin layer at an interval of 500 µm. The first terminal was formed in the shape of a mesh in which conductor wires having a width of 7.5 µm (the height of the conductor wire corresponds to the thickness of the first terminal) crossed each other. An interval between adjacent conductor wires (the diameter $D_1$ of a circle inscribed in an opening defined by the conductor wires (hereinafter, referred to as "the diameter $D_1$ of an inscribed circle")) was set to 5 µm. A distance between the first terminal and the third terminal was 4 µm. In the ACF, conductive particles having a diameter $D_2$ of 10 µm were dispersed in the epoxy resin. Here, a resin core configured by an acrylic resin on which a nickel-aluminum (Ni/Au) plating layer was stacked was used as conductive particles.

A test sample of this example having the above-mentioned structure was subjected to the following thermocompression bonding test.

First, an ACF was placed on the first wiring body; the second wiring body was placed on the ACF; and the ACF, the first wiring body, and the second wiring body were subjected to thermocompression bonding under conditions of 180° C., 3 MPa, and 15 seconds. After that, the ACF, the first wiring body, and the second wiring body were cooled to normal temperature, and a wiring body assembly in which the first and second wiring bodies were connected to each other through a connection body was obtained.

Then, the wiring body assembly was cut lengthwise in the extending direction of the conductor wire. After that, the number of conductive particles, which were interposed between the first and third terminals, per unit length of 6 mm in cross-sectional view was counted.

Test results of Example 1 are illustrated in Table 1.

TABLE 1

|  | The Number of Conductive Particles |
|---|---|
| Example 1 | 20 |
| Comparative Example | 7 |

As illustrated in Table 1, it was confirmed in Example 1 that twenty conductive particles were present between the first and third terminals.

Comparative Example

A test sample, which was the same as the test sample of Example 1 except that first terminals of a first wiring body were formed in a solid pattern, was prepared in Comparative Example.

This test sample was also subjected to a thermocompression bonding test in the same manner as Example 1. Then, the number of conductive particles was counted in the same manner as Example 1. Meanwhile, in Comparative Example, the wiring body assembly was cut lengthwise in a direction corresponding to the extending direction of the conductor wire of Example 1.

As illustrated in Table 1, it was confirmed in Comparative Example that seven conductive particles were present between the first and third terminals.

Example 2

A test sample, which was the same as the test sample of Example 1 except that the thickness of the first terminal was set to 3 μm and an interval between adjacent conductor wires (that is, the diameter $D_1$ of an inscribed circle) was set to 10 μm, was prepared in Example 2.

This test sample was subjected to the same test as the above-mentioned thermocompression bonding test.

After that, the wiring body assembly was cut lengthwise in the extending direction of the conductor wire, and a rate of the compressive deformation of the conductive particle (hereinafter, referred to as a "crush frequency") was calculated on the basis of the following Formula (11).

$$A_1/A_2 \times 100 = \text{crush frequency (\%)} \quad (11)$$

In the Formula (11), $A_1$ denotes the number of compressively deformed conductive particles (hereinafter, referred to as "crushed particles") per unit length of 1 cm and $A_2$ denotes the total number of conductive particles per unit length of 1 cm. Meanwhile, conductive particles satisfying the following Formula (12) were determined as crushed particles here.

$$R_1 < R_0 \times 0.7 \quad (12)$$

In the Formula (12), $R_0$ denotes the diameter of a conductive particle in an unloaded state and $R_1$ denotes the diameter of a compressively deformed conductive particle when a load was applied under a condition of 3 MPa in the thermocompression bonding test.

As a result of the thermocompression bonding test, it was determined that an effect of improving the connection reliability between the first and second wiring bodies was excellent in a case in which a crush frequency was 80% or more, and it was determined that an effect of improving the connection reliability between the first and second wiring bodies was present in a case in which a crush frequency was 35% or more.

Test results of Example 2 are illustrated in Table 2.

TABLE 2

|  | Diameter $D_1$ of Inscribed Circle [μm] | Diameter $D_2$ of Conductive Particle [μm] | $D_1/D_2$ | Storage Modulus [MPa] | Crush Frequency [%] |
|---|---|---|---|---|---|
| Example 2 | 10 | 10 | 1 | 20 | 40 |
| Example 3 | 6.7 | 10 | 0.67 | 20 | 83 |
| Example 4 | 5 | 10 | 0.5 | 20 | 89 |
| Example 5 | 10 | 10 | 1 | 50 | 45 |
| Example 6 | 6.7 | 10 | 0.67 | 50 | 92 |
| Example 7 | 5 | 10 | 0.5 | 50 | 98 |

Since a crush frequency was 35% or more in Example 2 as illustrated in Table 2, it was found out that an effect of improving the connection reliability between the first and second wiring bodies was present.

Example 3

A test sample, which was the same as the test sample of Example 1 except that the thickness of the first terminal was set to 3 μm and an interval between adjacent conductor wires (that is, the diameter $D_1$ of an inscribed circle) was set to 6.7 μm, was prepared in Example 3.

This test sample was also subjected to a thermocompression bonding test in the same manner as Example 1. Then, a crush frequency was calculated in the same manner as Example 2. Since a crush frequency was 80% or more in Example 3 as illustrated in Table 2, it was found out that an effect of improving the connection reliability between the first and second wiring bodies was excellent.

Example 4

A test sample, which was the same as the test sample of Example 1 except that the thickness of the first terminal was set to 3 μm, was prepared in Example 4.

This test sample was also subjected to a thermocompression bonding test in the same manner as Example 1. Then, a crush frequency was calculated in the same manner as Example 2. Since a crush frequency was 80% or more in Example 4 as illustrated in Table 2, it was found out that an effect of improving the connection reliability between the first and second wiring bodies was excellent.

Example 5

A test sample, which was the same as the test sample of Example 1 except that an acrylic resin having a storage modulus of 50 MPa at a temperature within a range of 130 to 200° C. was used as the material of the first resin layer, the thickness of the first terminal was set to 3 μm, and an interval between adjacent conductor wires (that is, the diameter $D_1$ of an inscribed circle) was set to 10 μm, was prepared in Example 5.

This test sample was also subjected to a thermocompression bonding test in the same manner as Example 1. Then, a crush frequency was calculated in the same manner as Example 2. Since a crush frequency was 35% or more in Example 5 as illustrated in Table 2, it was found out that an effect of improving the connection reliability between the first and second wiring bodies was present.

Example 6

A test sample, which was the same as the test sample of Example 1 except that an acrylic resin having a storage modulus of 50 MPa at a temperature within a range of 130 to 200° C. was used as the material of the first resin layer, the thickness of the first terminal was set to 3 μm, and an interval between adjacent conductor wires (that is, the diameter $D_1$ of an inscribed circle) was set to 6.7 μm, was prepared in Example 6.

This test sample was also subjected to a thermocompression bonding test in the same manner as Example 1. Then, a crush frequency was calculated in the same manner as Example 2. Since a crush frequency was 80% or more in Example 6 as illustrated in Table 2, it was found out that an effect of improving the connection reliability between the first and second wiring bodies was excellent.

Example 7

A test sample, which was the same as the test sample of Example 1 except that an acrylic resin having a storage modulus of 50 MPa at a temperature within a range of 130 to 200° C. was used as the material of the first resin layer and the thickness of the first terminal was set to 3 μm, was prepared in Example 7.

This test sample was also subjected to a thermocompression bonding test in the same manner as Example 1. Then, a crush frequency was calculated in the same manner as Example 2. Since a crush frequency was 80% or more in Example 7 as illustrated in Table 2, it was found out that an effect of improving the connection reliability between the first and second wiring bodies was excellent.

FIG. 17 illustrates a graph which illustrates the test results of Example 2, Example 3, Example 4, Example 5, Example 6, and Example 7 and of which axes represent the crush frequency of a conductive particle and a ratio ($D_1/D_2$) of the diameter $D_1$ of a circle inscribed in the opening to the diameter $D_2$ of the conductive particle.

As described above, according to the results illustrated in Table 1, when Example 1 and Comparative Example are compared to each other, the number of conductive particles interposed between the first and third terminals was large in Example 1 and the number of conductive particles interposed between the first and third terminals was small in Comparative Example. Since the mesh formed in the first terminal caught many conductive particles, it is thought that many conductive particles were interposed between the first and second terminals and connection reliability between the first and second wiring bodies is improved by the conductive particles.

Further, according to the results illustrated in Table 2 and FIG. 17, it was found out that an effect of improving the connection reliability between the first and second wiring bodies was excellent since a crush frequency was 80% or more in Example 3, Example 4, Example 6, and Example 7 among Examples. Furthermore, since a crush frequency was 35% or more in Example 2 and Example 5, it was found out that an effect of improving the connection reliability between the first and second wiring bodies was present.

As described above, from the results of Examples 2 to 4 and the results of Examples 5 to 7, it is thought that connection reliability between the first and second wiring bodies is improved since the Formula (3) is satisfied. Moreover, from the results of Examples 2 to 7, it is thought that connection reliability between the first and second wiring bodies is improved when the storage modulus of the material of the first resin layer at a temperature within a range of 130 to 200° C. is 20 MPa or more.

EXPLANATIONS OF LETTERS OR NUMERALS

1 . . . touch panel
2 . . . structure with a conductor layer
3 . . . cover panel
31 . . . transparent portion
32 . . . blocking portion
4 . . . wiring body assembly
5, 5B . . . first wiring body
6 . . . first resin layer
61 . . . smooth portion
611 . . . contact surface
62 . . . support portion
7 . . . first conductor layer
71 . . . first mesh-shaped electrode layer
711 . . . electrode conductor wire
76 . . . first lead-out wire
761 . . . lead portion
77 . . . first terminal
78a, 78b . . . terminal conductor wire
781 . . . contact surface
782 . . . top surface
7821 . . . top surface-flat portion
783 . . . side surface
7831, 7832 . . . end portion
7833 . . . side surface-flat portion
79 . . . opening
8 . . . second resin layer
81 . . . main portion
82 . . . support portion
9 . . . second conductor layer
91 . . . second mesh-shaped electrode layer
96 . . . second lead-out wire
961 . . . lead portion
97 . . . second terminal
98 . . . terminal conductor wire
10 . . . third resin layer
11a, 11b, 11c . . . second wiring body
12a, 12b, 12c . . . base
13a, 13b, 13c . . . third terminal
14a, 14b, 14c . . . wire
15 . . . connection body
151 . . . resin material
152 . . . conductive particle
16 . . . transparent adhesive layer
17a, 17b . . . protective base
400 . . . intaglio
401 . . . recessed portion
410 . . . conductive material (first conductor layer)
411 . . . surface 420 . . . resin material (first resin layer)
430 . . . support base
440 . . . first intermediate
450 . . . resin material (second resin layer)
460 . . . intaglio
461 . . . recessed portion
470 . . . conductive material (second conductor layer)
471 . . . surface
480 . . . second intermediate
490 . . . ACF
500 . . . intermediate
510 . . . resin material (third resin layer)

The invention claimed is:

1. A wiring body assembly comprising:
a first wiring body including a support layer and a conductor layer provided on the support layer and including a first terminal;
a second wiring body including a second terminal; and
a connection body including a resin material and conductive particles dispersed in the resin material and interposed between the first and second terminals such that the first wiring body and the second wiring body are electrically connected, wherein
the first terminal includes conductor wires arranged in the shape of a mesh,
the connection body is in a gap between the conductor wires,
the conductor wires define openings by crossing each other, and
the following Formula (2) is satisfied $$D_1 \leq D_2 \times \tfrac{2}{3} \qquad (2)$$

in the Formula (2), $D_1$ denotes a diameter of a circle inscribed in the openings and $D_2$ denotes the diameter of a conductive particle.

2. The wiring body assembly according to claim 1, wherein the conductor wire faces the second terminal through the connection body, and includes a substantially flat surface having a linear shape in cross-sectional view.

3. The wiring body assembly according to claim 1, wherein
the support layer is made of a resin material, and
a storage modulus of the resin material of the support layer at a temperature within a range of 130 to 200° C. is 10 MPa or more.

4. A structure with a conductor layer, the structure comprising:
the wiring body assembly according to claim 1; and
a support provided on at least one main surface of the first wiring body.

5. A touch sensor comprising:
the structure according to claim 4.

* * * * *